(12) United States Patent
Takigawa et al.

(10) Patent No.: US 11,133,643 B2
(45) Date of Patent: Sep. 28, 2021

(54) LASER APPARATUS INCLUDING DEW CONDENSATION PREVENTION FUNCTION

(71) Applicant: FANUC CORPORATION, Yamanashi (JP)

(72) Inventors: Hiroshi Takigawa, Yamanashi (JP); Yuji Nishikawa, Yamanashi (JP); Hiroyuki Yoshida, Yamanashi (JP); Tadashi Kurosawa, Yamanashi (JP); Atsushi Mori, Yamanashi (JP); Toshiyasu Shiomi, Yamanashi (JP); Michinori Maeda, Yamanashi (JP); Akihiko Nishio, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/142,078

(22) Filed: Sep. 26, 2018

(65) Prior Publication Data

US 2019/0109433 A1 Apr. 11, 2019

(30) Foreign Application Priority Data

Oct. 6, 2017 (JP) .............................. JP2017-195848

(51) Int. Cl.
*H01S 5/024* (2006.01)
*H01S 5/022* (2021.01)
(Continued)

(52) U.S. Cl.
CPC .......... *H01S 5/02423* (2013.01); *H01S 5/022* (2013.01); *H01S 5/06804* (2013.01);
(Continued)

(58) Field of Classification Search
CPC .. H01S 5/02423; H01S 5/06804; H01S 5/022; H01S 5/0222; H01S 5/0617; H01S 5/06825; H01S 5/4025
See application file for complete search history.

(56) References Cited

U.S. PATENT DOCUMENTS 10,516,247 B2 * 12/2019 Maeda .................. H01S 5/0014
2003/0198264 A1 10/2003 Vetrovec et al.
(Continued)

FOREIGN PATENT DOCUMENTS

CN 104083211 A 10/2014
CN 106207720 A 12/2016
(Continued)

OTHER PUBLICATIONS

An Office Action mailed by the Japanese Patent Office dated Jul. 9, 2019, which corresponds to Japanese Patent Application No. 2017-195848 and is related to U.S. Appl. No. 16/142,078; with English translation.
(Continued)

*Primary Examiner* — M. A. Golub-Miller
(74) *Attorney, Agent, or Firm* — Studebaker & Brackett PC

(57) ABSTRACT

A laser apparatus includes: a cooling capacity control means which controls the cooling capacity of a heat receiving/cooling unit; a surrounding member which surrounds a dew condensation prevention target unit including a heat generating unit and which reaches a surrounding member equilibrium temperature higher than the maximum dew point temperature within a housing as the temperature of the heat generating unit is increased; and a temperature detection means which detects the temperature of the surrounding member, a control unit compares, while a current output command is being output to a laser power supply unit, a surrounding member temperature with a switching tempera-
(Continued)

ture previously set lower than the surrounding member equilibrium temperature and when the surrounding member temperature is lower than the switching temperature, the control unit controls the cooling capacity control means such that the cooling capacity of the heat receiving/cooling unit is a low level whereas when the surrounding member temperature is equal to or more than the switching temperature, the control unit controls the cooling capacity control means such that the cooling capacity of the heat receiving/cooling unit is equal to or higher than a standard level.

10 Claims, 15 Drawing Sheets

(51) Int. Cl.
 *H01S 5/068* (2006.01)
 *H01S 5/06* (2006.01)
 *H01S 5/0222* (2021.01)
 *H01S 5/40* (2006.01)
(52) U.S. Cl.
 CPC .......... *H01S 5/0222* (2013.01); *H01S 5/0617* (2013.01); *H01S 5/06825* (2013.01); *H01S 5/4025* (2013.01)

(56) References Cited

U.S. PATENT DOCUMENTS

| | | | |
|---|---|---|---|
| 2004/0161011 | A1 | 8/2004 | Tsunekane |
| 2004/0202211 | A1 | 10/2004 | Paetzel |
| 2004/0240800 | A1 | 12/2004 | Uchida |
| 2009/0059978 | A1 | 3/2009 | Nagashima |
| 2011/0317958 | A1* | 12/2011 | Nadeau ............ G02B 6/4256 385/14 |
| 2015/0226417 | A1 | 8/2015 | Hirose |
| 2016/0336707 | A1* | 11/2016 | Nishio ............... G01K 13/00 |
| 2016/0365701 | A1* | 12/2016 | Takigawa .......... H01S 5/02423 |
| 2017/0063017 | A1 | 3/2017 | Mori |
| 2017/0146895 | A1* | 5/2017 | Ito ................. G03B 21/2033 |
| 2017/0163005 | A1* | 6/2017 | Takigawa ........... H01S 3/042 |
| 2018/0083418 | A1* | 3/2018 | Kanskar .............. F25B 19/005 |
| 2018/0166852 | A1* | 6/2018 | Nukui ............... H01S 5/02438 |
| 2019/0052051 | A1* | 2/2019 | Telford ................. H01S 5/02 |
| 2019/0109429 | A1* | 4/2019 | Maeda ............... H01S 5/02423 |
| 2020/0136344 | A1* | 4/2020 | Oomori .............. H01S 5/4025 |
| 2021/0077946 | A1* | 3/2021 | Ryudo ................. H01S 5/022 |

FOREIGN PATENT DOCUMENTS

| | | |
|---|---|---|
| CN | 106486881 A | 3/2017 |
| DE | 10 2016 006 470 A1 | 12/2016 |
| DE | 10 2016 006 891 A1 | 12/2016 |
| DE | 10 2016 120 175 A1 | 5/2017 |
| DE | 10 2016 123 330 A1 | 6/2017 |
| DE | 10 2017 104 438 A1 | 9/2017 |
| DE | 10 2017 104 699 A1 | 10/2017 |
| JP | S55-001119 A | 1/1980 |
| JP | H05-077992 U | 10/1993 |
| JP | H06-32336 B2 | 4/1994 |
| JP | H06-307808 A | 11/1994 |
| JP | 2001-326410 A | 11/2001 |
| JP | 2002-076500 A | 3/2002 |
| JP | 2006-196644 A | 7/2006 |
| JP | 2008-093330 A | 4/2008 |
| JP | 2009-072361 A | 4/2009 |
| JP | 2009-231529 A | 10/2009 |
| JP | 2010-212475 A | 9/2010 |
| JP | 2010-219516 A | 9/2010 |
| JP | 2012-059993 A | 3/2012 |
| JP | 2012-089417 A | 5/2012 |
| JP | 5261612 B2 | 8/2013 |
| JP | 2016-219456 A | 12/2016 |
| JP | 2017-005141 A | 1/2017 |
| JP | 2017-103414 A | 6/2017 |

OTHER PUBLICATIONS

"Decision to Grant a Patent" Office Action issued in JP 2017-195848; dated by the Japanese Patent Office dated Dec. 3, 2019.
"Notification of Reasons for Refusal" Office Action issued in JP 2017-195848; dated by the Japanese Patent Office dated Oct. 29, 2019.
An Office Action issued by the State Intellectual Property Office of the Peoples Republic of China dated Mar. 10, 2020, which corresponds to Chinese Patent Application No. 201811140118.9 and is related to U.S. Appl. No. 16/142,078 with English language translation.
An Office Action mailed by the German Patent Office dated Oct. 2, 2020, which corresponds to German Patent Application No. 10 2018 216 840.7 and is related to U.S. Appl. No. 16/142,078; with English language translation.

\* cited by examiner

LASER APPARATUS INCLUDING DEW CONDENSATION PREVENTION FUNCTION

This application is based on and claims the benefit of priority from Japanese Patent Application No. 2017-195848, filed on 6 Oct. 2017, the content of which is incorporated herein by reference.

BACKGROUND OF THE INVENTION

Field of the Invention

The present invention relates to a laser apparatus which includes a dew condensation prevention function. More specifically, the present invention relates to a laser apparatus of a water-cooled system which is the most common cooling method among high-power lasers having a large amount of heat generation, and relates to a laser apparatus which includes the function of preventing dew condensation in a portion to be cooled that is problematic in the water-cooled laser apparatus.

Related Art

In a high-power laser apparatus which is used in laser cutting or the like, in order for an increase in the temperature of a heat generating part caused by the heat generation of the heat generating part such as a laser oscillator to be reduced, the heat generating part is often water-cooled. However, when a dew point temperature within the laser apparatus is higher than the temperature of cooling water, dew condensation occurs, and thus in the heat generating part and parts which are cooled together with the heat generating part, damage caused by electrical leakage or corrosion may occur. Hence, conventionally, the interior is dehumidified with a panel cooler or the like.

Disadvantageously, however, in the use of the panel cooler, for example, the cost thereof is increased, a large space is required and the reliability of the laser apparatus depends on the reliability of the panel cooler.

When it is determined that dew condensation may occur, one way is to reduce the flow rate of the cooling water. However, naturally, since the temperature of the heat generating part such as the laser oscillator is increased beyond a standard temperature, the lifetime consumption thereof is accelerated, and thus it is impossible to prevent the lifetime and the reliability thereof from being adversely affected.

It is a common issue to prevent, by cooling, dew condensation which may occur, and a large number of technologies have conventionally been proposed. For example, Patent Document 1 discloses a semiconductor laser apparatus which includes a semiconductor laser, a cooling means that cools the semiconductor laser, a temperature detection means that detects the temperature of the atmosphere of the semiconductor laser, a humidity detection means that detects the humidity of the atmosphere of the semiconductor laser, a memory that stores the dew point temperature property of water with respect to humidity and a control means, and in which the control means calculates a dew point temperature based on the humidity detected by the humidity detection means with reference to the memory and controls the cooling means such that the temperature detected by the temperature detection means is higher than the dew point temperature. In this technology, since the cooling means is controlled such that the temperature of the semiconductor laser is higher than the dew point temperature, when the dew point temperature is high, the temperature of the semiconductor laser is increased. Hence, the above-mentioned problem in which when dew condensation is avoided, the lifetime consumption of the semiconductor laser is accelerated is not solved.

Patent Document 2 discloses a dew condensation prevention device which includes: a means that is provided in a wavelength stabilizing light source for controlling an injection current supplied to a semiconductor laser and the temperature of the semiconductor laser so as to stabilize the wavelength of laser light output from the semiconductor laser and that collects environment information causing the occurrence of dew condensation in the semiconductor laser; and a dew condensation determination means that monitors the semiconductor laser based on the environment information collected by this means so as to stop the temperature control on the semiconductor laser when there is a possibility of the occurrence of dew condensation. As is expected, even in this technology, since the temperature control on the semiconductor laser is stopped when there is a possibility of the occurrence of dew condensation, under an environment in which a dew point temperature is high, the cooling of the semiconductor laser is insufficient, and thus the problem in which the lifetime consumption of the semiconductor laser is accelerated is not solved.

Patent Document 3 discloses a light source device which includes, within a translucent container; a mounting substrate that incorporates a plurality of solid state light emitting devices; a cooling flow channel that cools heat generated in the mounting substrate; an adjustment means that adjusts the amount of cooling water flowing into the cooling flow channel or the temperature of the cooling water flowing thereinto; a first detection means for detecting the temperature of the mounting substrate; a second detection means for detecting at least one of the temperature, the humidity and the pressure of the ambient gas of the mounting substrate; and a control unit that controls the adjustment of the adjustment means, and in which the control unit compares and determines a cooling control reference value previously held and the results of the detection by the first and second detection means so as to adjust the cooling water with the adjustment means. In order to prevent dew condensation, this device detects the temperature of the substrate, the humidity of the ambient gas of the substrate and the like so as to adjust the amount of cooling water flowing thereinto or the temperature of the cooling water flowing thereinto. However, as is expected, even in this technology, when the humidity of the ambient gas of the substrate is high, the temperature of the substrate is increased such as by a method of reducing the amount of cooling water flowing thereinto, and thus the problem in which the lifetime consumption of the solid state light emitting device is accelerated is not solved.

Patent Document 4 discloses a light stabilizing device which is used in an electronic device including a plurality of electronic parts including a light source, a main power supply for supplying a driving current to the electronic parts and a start button for the light source, and which includes: a heating power supply that supplies a heating current to the light source so as to make the light source generate heat by itself in a non-emission state; and a control unit, that performs control such that after power is supplied to the main power supply, the heating current is first supplied to the light source among the electronic parts so as to increase the temperature of the light source beyond a dew point temperature and that when the start button is pressed down, the driving current is supplied so as to make the light source emit light. This document only discloses that in order to prevent dew condensation on the light source, the heating current is made to flow before the light emission of the light source so as to increase the temperature of the light source beyond the dew point temperature, and does not disclose a technology for cooling the light source. Hence, in this technology, when the dew point temperature is high, the temperature of the light source is increased in order to prevent dew condensation, and thus the problem in which the lifetime consumption of the light source is accelerated is not solved.

Patent Document 5 discloses an illumination device which applies light to plants and which includes: a light source unit that includes a light source; a cooling unite, that includes a cooling portion for passing a coolant through the interior thereof, that supplies the coolant into the cooling portion so as to exchange heat with the light source unit and that thereby cools the light source; a temperature sensor that measures the temperature of the light source unit; and a coolant circulation control unit that starts or stops the supply of the coolant based on the temperature measured by the temperature sensor. This document discloses that an upper limit temperature and a lower limit temperature are set for the coolant circulation control unit and that when the temperature sensor detects a temperature higher than the upper limit temperature, the supply of the coolant is started whereas when the temperature sensor detects a temperature lower than the lower limit temperature, the supply of the coolant is stopped. The document also mentions that the dew point temperature in the space is set as the above-mentioned lower limit temperature. However, even in this technology, when a dew point temperature is high, the supply of the coolant is stopped even if the temperature of the light source unit is high, and thus when the dew point temperature is high, the problem in which the lifetime consumption of the light source is accelerated is not solved.

Patent Document 6 discloses a radiation image shooting device which includes: a radiation image information detector that detects radiation image information on a subject; a housing that stores the radiation image information detector; a temperature detector that detects the external temperature of the housing; a humidity detector that detects the external humidity of the housing; a temperature adjustment means that adjusts the internal temperature of the housing; and a control means that controls the temperature adjustment means based on the results of the detection of the temperature detector and the humidity detector so as to keep the radiation image information detector at a predetermined temperature or less and that controls the temperature within the housing so as to be able to avoid the occurrence of dew condensation within the housing. However, in this technology, since the temperature within the housing is controlled but the dew point temperature within the housing is not changed, when the dew point temperature is high, in order to prevent dew condensation, the temperature of the radiation image information detector is inevitably kept at a temperature higher than the temperature desired to be originally maintained. Hence, this document also does not disclose a method of solving the problem in which the lifetime consumption is accelerated.

Patent Document 7 discloses an X-ray diagnostic device which includes: an X-ray detector temperature adjustment means that adjusts the temperature of an X-ray detector used for X-ray fluoroscopy and shooting; a temperature measuring means that measures a temperature within a chamber where the X-ray detector is installed; a humidity measuring means that measures a humidity within the chamber; a saturated water vapor pressure storage means that previously stores saturated water vapor pressure values in individual temperatures; and a control means that calculates a dew point temperature within the chamber from the chamber temperature output from the temperature measuring means, the humidity output from the humidity measuring means and the saturated water vapor pressure values stored in the saturated water vapor pressure storage means so as to perform control such that the temperature of a heat medium exceeds the dew point temperature. However, in this technology, since the control is performed such that the temperature of the heat medium circulated around the X-ray detector exceeds the dew point temperature, when the dew point temperature is high, the heat medium having a high temperature is circulated and thus the temperature of the X-ray detector is increased beyond the temperature desired to be originally maintained, with the result that the lifetime consumption is likewise accelerated.

Patent Document 8 discloses a cooling system for an electronic device which includes: a chamber where the electronic device is arranged; an evaporator that is provided close to the electronic device and that cools the electronic device by vaporizing a coolant with heat generated from the electronic device; and a condenser that cools the coolant supplied to the evaporator by utilization of an external air temperature, and further includes: an external temperature measuring means that measures the external temperature; and a first control means that controls the condensation temperature of the coolant in the condenser based on the result of the measurement by the external temperature measuring means such that the temperature of the coolant at the entrance of the evaporator is kept at a predetermined temperature higher than a dew point temperature within the chamber. However, as is expected, even in this technology, since the control is performed such that the condensation temperature of the coolant in the condenser is kept at the predetermined temperature higher than the dew point temperature within the chamber, when the dew point temperature within the chamber is increased, the temperature of the coolant supplied to the evaporator for cooling the electronic device is increased, with the result that it is likely that the electronic device cannot be sufficiently cooled.

As described above, in all the conventional technologies, in order to prevent dew condensation on a portion to be cooled in the semiconductor laser or the like and to prevent the temperature of the portion to be cooled from being lowered beyond the dew point temperature within the housing or the chamber where the portion to be cooled is stored, for example, the temperature of the coolant is increased or the supply of the coolant is stopped, with the result that the portion to be cooled is prevented from being excessively cooled. However, in this method, when the dew point temperature is high, the portion to be cooled is used at a temperature higher than a cooling temperature at which the portion to be cooled is desired to be originally maintained, and thus as compared with a case where the portion to be cooled is kept at the cooling temperature at which the portion to be cooled is desired to be originally maintained, the lifetime consumption is disadvantageously accelerated or it is disadvantageously impossible to obtain desired performance. The conventional technologies described above do not disclose any technologies at all for solving this problem. Naturally, a dehumidifier such as a panel cooler is used to lower the dew point temperature so as to prevent the occurrence of dew condensation on the portion to be cooled, and thus it is possible to cool the portion to be cooled to the cooling temperature desired to be originally maintained. However, in the use of the dehumidifier, as described previously, there are problems such as the cost thereof is increased, a large space is required and the reliability of the laser apparatus depends on the reliability of the panel cooler. Hence, a technology in which without being dehumidified with a dehumidifier, even under an environment where a dew point temperature is high, it is possible to prevent dew condensation on the portion to be cooled while the portion to be cooled is being kept at the cooling temperature desired to be originally maintained is not disclosed at all in the conventional technologies described above.

Patent Document 1: Japanese Examined Patent Application Publication No. H06-32336

Patent Document 2: Japanese Unexamined Patent Application, Publication No. H06-307808

Patent Document 3: Japanese Unexamined Patent Application, Publication No. 2012-89417

Patent Document 4: Japanese Unexamined Patent Application, Publication No. 2010-212475

Patent Document 5: Japanese Patent No. 5261612

Patent Document 6: Japanese Unexamined Patent Application, Publication No. 2009-72361

Patent Document 7: Japanese Unexamined Patent Application, Publication No. 2008-93330

Patent Document 8: Japanese Unexamined Patent Application, Publication No. 2009-231529

SUMMARY OF THE INVENTION

A heat generating part is cooled with cooling water such that an increase in the temperature of the heat generating part is reduced, and thus when the heat generating part is driven under standard driving conditions, the temperature of the heat generating part can be kept at a predetermined standard part temperature. However, even when the temperature of a heat generating unit in the heat generating part is somewhat high, a portion which is cooled together with the heat generating unit when the heat generating part is cooled is lower in temperature than the heat generating unit. Hence, when the dew point temperature of air around the heat generating part is high, dew condensation may occur in a low-temperature portion or the portion to be cooled including both the heat generating unit and the portion which is cooled together with the heat generating unit for cooling the heat generating unit.

The dew point temperature is not changed even by change or the temperature of air. However, since the dew point temperature can be lowered by dehumidification with a dehumidifier such as a panel cooler, it is possible to prevent dew condensation. However, in the use of the dehumidifier such as a panel cooler, as described previously, there are problems such as the cost thereof is increased, a large space is required and the reliability of the laser apparatus depends on the reliability of the panel cooler. On the other hand, when dehumidification is not performed, the dew point temperature is not lowered, and thus it is necessary to prevent dew condensation. Here, as in the conventional technologies described above, in a case where the cooling using the cooling water is reduced so that the temperature of the low-temperature portion of the portion to be cooled is prevented from being lowered beyond the dew point temperature and where the dew point temperature is high, when the heat generating part is driven under the standard driving conditions, the temperature of the heat generating part cannot be kept at the predetermined standard part temperature which is the cooling temperature desired to be originally maintained. Consequently, disadvantageously, the temperature of the heat generating part is higher than the standard part temperature, and thus the lifetime consumption is accelerated so as to shorten the lifetime, the reliability thereof is lowered and the desired performance thereof cannot be obtained.

Hence, an object of the present invention to be achieved is to provide a laser apparatus which can prevent dew condensation on a portion to be cooled including a heat generating unit, in particular without being dehumidified with a dehumidifier, even under an environment in which a dew point temperature is high while the heat generating unit is being kept at a cooling temperature desired to be originally maintained, and in which the size of the laser apparatus can be reduced at low cost, in which the reliability thereof is high and in which the lifetime thereof is long.

(1) A laser apparatus according to the present invention is a laser apparatus (for example, a laser apparatus 1, 100, 200, 300, 400, 500, 600, 700 which will be described later) which includes: a housing (for example, a housing 2 which will be described later); at least one or more laser oscillators (for example, laser oscillator 3 which will be described later) within the housing 2; and one or more laser power supply units (for example, a laser power supply unit 4 which will be described later) that supply a current to the laser oscillator, in which the laser oscillator includes: one or more heat generating units (for example, a heat generating unit 9 which will be described later) that generate heat for laser oscillation; and one or more heat receiving/cooling units (for example, a heat receiving/cooling unit 11 which will be described later) that are thermally connected to a dew condensation prevention target unit including at least the heat generating unit and that include a cooling water flow path (for example, a cooling water flow path 10 which will be described later) for passing cooling water for cooling the dew condensation prevention target unit and to which a cooling water piping system (for example, a cooling water piping system 5 which will be described later) for passing the cooling water to the cooling water flow path is connected, the laser apparatus further includes: one or more cooling capacity control means (for example, a cooling capacity control means 6 which will be described later) for controlling a cooling capacity which cools the heat receiving/cooling unit with the cooling water passing through the cooling water piping system; a control unit (for example, a control unit 7 which will be described later) which controls at least the cooling capacity control means and the laser power supply unit; a surrounding member (for example, a surrounding member 14 which will be described later) which is close to the dew condensation prevention target unit (for example, a dew condensation prevention target unit 13 which will be described later) so as to surround the dew condensation prevention target unit; and at least one or more temperature detection means (for example, a temperature detection means 15 which will be described later) which detect the temperature of a predetermined portion of the surrounding member and outputs, as the result of the detection, a surrounding member temperature to the control unit, the surrounding member is formed so as to reach a surrounding member equilibrium temperature higher than the maximum dew point temperature assumed with respect to air within the housing as a temperature of the heat generating unit is increased in a state where the laser apparatus or the laser oscillator is driven under standard driving conditions in which laser light of a standard optical output is emitted and in which the cooling capacity for cooling the heat receiving/cooling unit is controlled by the cooling capacity control means to have a standard level and where the laser apparatus or the laser oscillator reaches a substantially equilibrium state and the control unit compares, while a current output command is being output to the laser power supply unit, the surrounding member temperature detected by the temperature detection means with a switching temperature previously set lower than the surrounding member equilibrium temperature, and when the surrounding member temperature is lower than the switching temperature, the control unit controls the cooling capacity control means such that the cooling capacity for cooling the heat receiving/cooling unit is lower than the standard level whereas when the surrounding member temperature is equal to or more than the switching temperature, the control unit controls the cooling capacity control means such that the cooling capacity for cooling the heat receiving/cooling unit is equal to or higher than the standard level.

Preferably, the laser apparatus described in (1) further includes: one or more dew point temperature detection means (for example, a dew point temperature detection means 19 which will be described later) for detecting a dew point temperature of air within the housing, and when the dew point temperature of the air within the housing detected by the dew point temperature detection means is assumed to be a housing interior dew point temperature, the switching temperature is set such that (switching temperature)=(housing interior dew point temperature)+(predetermined temperature).

(3) Preferably, in the laser apparatus described in (1) or (2), the maximum dew point temperature is set to a surrounding upper limit dew point temperature which is the upper limit of a dew point temperature of air around the laser apparatus derived from an allowable installation environment condition of the laser apparatus or an installation condition specification of the laser apparatus.

(4) Preferably, the laser apparatus described in (3), further includes: a notification means (for example, a display unit 20 which will be described later) which visually or auditorily provides, by control of the control unit, a notification that the installation environment of the laser apparatus fails outside a range of the installation condition specification when the dew point temperature of the air within the housing is higher than the surrounding upper limit dew point temperature.

(5) Preferably, in the laser apparatus described in any one of (1) to (4), the predetermined portion where the temperature detection means is installed is the surface of the surrounding member which is in contact with air or a portion in the vicinity of the surface, and is set to a portion whose temperature is the lowest except a protrusion portion of the surrounding member or a portion whose temperature is close to the temperature of the portion whose temperature is the lowest in a state where the laser apparatus or the laser oscillator reaches the equilibrium state.

(6) Preferably, the laser apparatus described in any one of (1) to (5), further includes: an auxiliary heating means (for example, an auxiliary heating means 21 which will be described later) which is thermally connected to the surrounding member, and the control unit controls the amount of heat generation in the auxiliary heating means such that the surrounding member temperature detected by the temperature detection means is higher than the maximum dew point temperature in a state where the laser apparatus or the laser oscillator reaches the equilibrium state.

(7) Preferably, in the laser apparatus described in any one of (1) to (6), the laser oscillator is a laser oscillator in which at least one or more LD modules (for example, a LD module 22 which will be described later) are a light emission source or an excitation light source, at least the one or more heat generating units are a laser diode chip (for example, a LD chip 23 which will be described later) which is one of constituent elements of the LD module, the surrounding member is a package (for example, a package 21 which will be described later) which is one of constituent elements of the LD module and within the package, at least the one or more laser diode chips are installed.

(8) Preferably, in the laser apparatus described in (7), the heat receiving/cooling unit is a cooling plate (for example, a cooling plate 27 which will be described later) in which the cooling water flow path is provided therewithin or in the surface thereof, and at least the one or more LD modules are arranged so as to be thermally connected to the cooling plate.

(9) Preferably, in the laser apparatus described in (8), a plurality of the LD modules are arranged on the cooling plate, and the temperature detection means is installed on the surface of the package of the LD module arranged in a position closest to an upstream side or in the vicinity of the surface at least when the cooling water is made to flow along the cooling water flow path of the cooling plate.

(10) Preferably, in the laser apparatus described in any one of (1) to (9), the cooling capacity control means includes on-off valves (for example, solenoid valves A, B, C which will be described later) which open and close a flow path of the cooling water and/or a flow rate adjustment valve which adjusts a flow rate in the flow path of the cooling water, and the control of the cooling capacity performed by the cooling capacity control means is the control of supply and non-supply of the cooling water or the flow rate performed by the on-off valves or the flow rate adjustment valve.

(11) Preferably, the laser apparatus described in any one of (1) to (10), further includes: a drainage mechanism (for example, a drainage mechanism 29 which will be described later) which drains, to the outside, dew condensation water generated within the housing by making the cooling water flow along the cooling water flow path.

(12) Preferably, in the laser apparatus described in (11), within the housing, a heat insulator (for example, a heat insulator 32 which will be described later) is arranged on the surface of at least one or more portions which are cooled by the cooling water.

(13) Preferably, in the laser apparatus described in (11) or (12), antirust treatment is performed on a portion where dew condensation occurs within the housing so as to reduce corrosion caused by dew condensation or a material of the portion where dew condensation occurs within the housing is an antirust material.

(14) Preferably, the laser apparatus described in any one of (1) to (13), includes: a plurality of the heat receiving/cooling units which are thermally connected to a plurality of the heat generating units; a plurality of the cooling capacity control means for independently controlling the cooling capacities which cool the heat receiving/cooling units; a plurality of the surrounding members which are close to the dew condensation prevention target units including the heat generating units so as to individually surround the dew condensation prevention target units; and a plurality of the temperature detection means which detect temperatures of the predetermined portions of the surrounding members, and the control unit individually controls the cooling capacity control means which control the cooling capacities for cooling the corresponding heat receiving/cooling units according to the results of the detection by the individual temperature detection means.

(15) Preferably, the laser apparatus described in any one of (1) to (13), includes: a plurality of the laser oscillators; a plurality of the heat receiving/cooling units which are individually and thermally connected to a plurality of the heat generating units that generate heat for laser oscillation in the laser oscillators; the cooling capacity control means for collectively controlling the cooling capacities that cool the heat receiving/cooling units; a plurality of the surrounding members which are close to the dew condensation prevention target units including the heat generating units so as to individually surround the dew condensation prevention target units; and a plurality of the temperature detection means which detect temperatures of the predetermined portions of the surrounding members, and the control unit controls the currents supplied from the corresponding laser power supply units to the laser oscillators such that the results of the detection by the individual temperature detection means are the same temperature.

According to the present invention, it is possible to provide a laser apparatus which can prevent dew condensation on a dew condensation prevention target unit including a heat generating unit, in particular without being dehumidified with a dehumidifier, even under an environment in which a dew point temperature is high while the heat generating unit is being kept at a cooling temperature desired to be originally maintained, and in which the size of the laser apparatus can be reduced at low cost, in which the reliability thereof is high and in which the lifetime thereof is long.

DETAILED DESCRIPTION OF THE INVENTION

Figure 1:
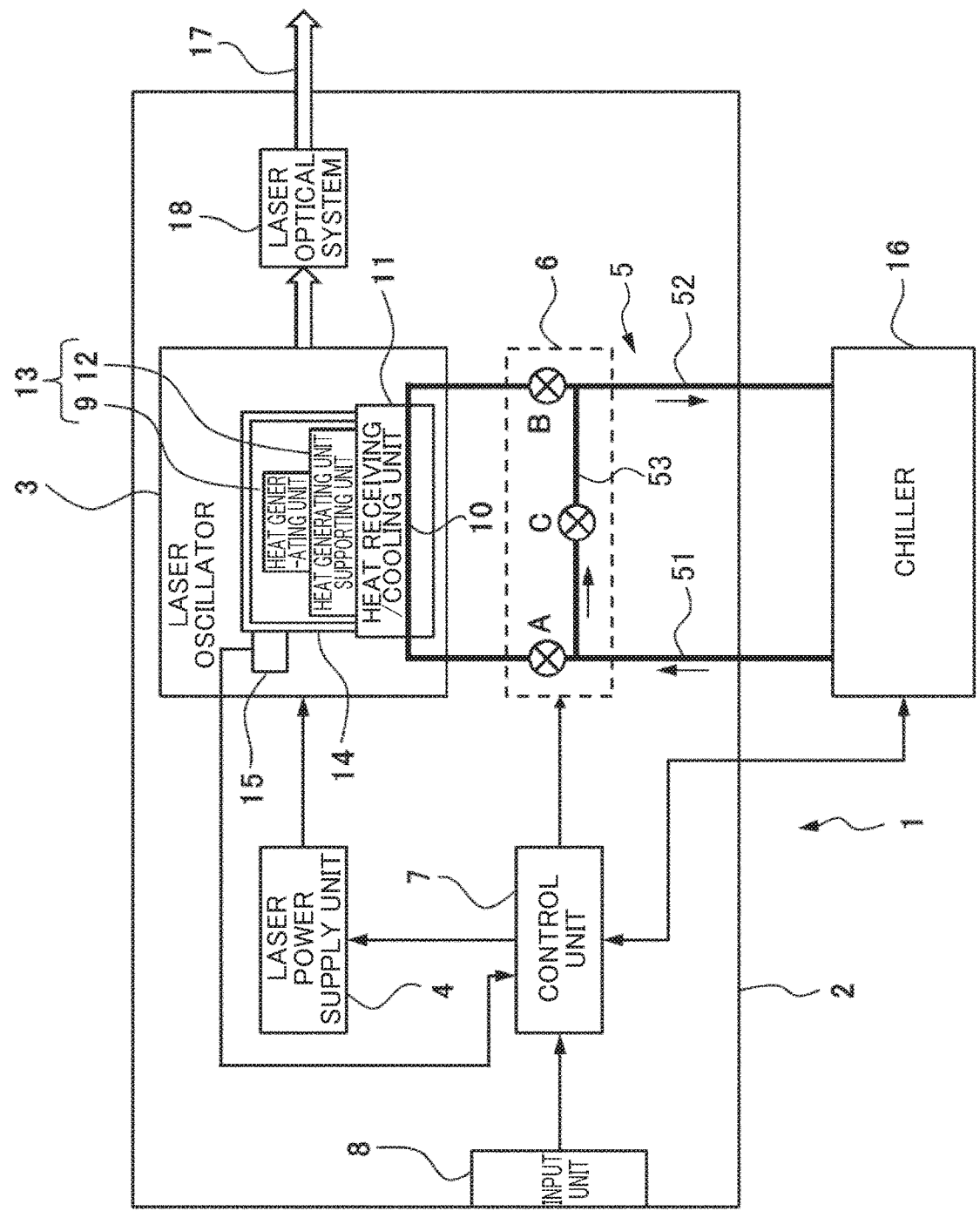
FIG. 1 is a block diagram showing a conceptual configuration of a laser apparatus according to a first embodiment of the present invention.

Embodiments of a laser apparatus according to the present invention will be described below with reference to drawings. In the drawings shown below, the same members are identified with the same reference numerals. Members which are identified with the same reference numerals in different drawings mean constituent elements which have the same functions. For ease of viewing of these drawings, scales are changed as necessary. A form shown in each of the drawings is an example for practicing the present invention, and the present invention is not limited to the forms shown in the figures.

First Embodiment

FIG. 1 is a block diagram showing a conceptual configuration of a laser apparatus 1 according to a first embodiment of the present invention. The laser apparatus 1 includes, within a housing 2, a laser oscillator 3, a laser power supply unit 4 which supplies a driving current to the laser oscillator 3, a cooling water piping system 5, a cooling capacity control means 6, a control unit 7 which controls at least the laser power supply unit 4 and the cooling capacity control means 6 and an input unit 8 which provides an instruction to the control unit 7.

Within the laser oscillator 3 described in the present embodiment, a heat generating unit 9, a heat receiving/cooling unit 11 and a heat generating unit supporting unit 12 are provided. The heat generating unit 9 is a part which generates heat for laser oscillation, and when the laser oscillator 3 has at least one or more LD (laser diode) modules as a light emission source or an excitation light source, the heat generating unit 9 corresponds to a laser diode chip (LD chip) which is one of the constituent elements of the LD module. The heat receiving/cooling unit 11 is provided so as to make thermal contact with the heat generating unit supporting unit 12. In the heat receiving/cooling unit 11, a cooling water flow path 10 is provided along which cooling water for cooling the heat generating unit supporting unit 12 and the heat generating unit 9 through the heat generating unit supporting unit 12 is made to flow. The cooling water flow path 10 is provided either in the inner surface or in the front surface of the heat receiving/cooling unit 11. The heat generating unit supporting unit 12 interposed between the heat generating unit 9 and the heat receiving/cooling unit 11 so as to be thermally connected to the heat generating unit 9, and thereby supports the heat generating unit 9. The heat generating unit supporting unit 12 is a part which is cooled together with the heat generating unit 9 when the heat generating unit 9 is cooled.

In the present embodiment, among the above-described parts within the laser oscillator 3, the heat generating unit 9 and the heat generating unit supporting unit 12 form a dew condensation prevention target unit 13 in which dew condensation needs to be prevented. The heat receiving/cooling unit 11 supports the heat generating unit supporting unit 12 so as to be thermally connected to the dew condensation prevention target unit 13.

The dew condensation prevention target unit 13 is surrounded by a surrounding member 14 which is arranged so as to be close to the dew condensation prevention target unit 13. Although the surrounding member 14 can preferably surround the dew condensation prevention target unit 13 with the heat receiving/cooling unit 11, when the heat generating unit 9 is the LD chip as described previously, the surrounding member 14 corresponds to a package which is one of the constituent elements of the LD module. Here, the surrounding member 14 is not necessarily limited to a surrounding member which surrounds, with the heat receiving/cooling unit 11, the entire periphery of the dew condensation prevention target unit 13 so as to completely enclose it, and the surrounding member 14 preferably substantially surrounds the dew condensation prevention target unit 13 with the heat receiving/cooling unit 11. Hence, the surrounding member 14 may have a portion through which air can communicate with the interior and the exterior of the surrounding member 14 as long as the object of the present invention is not inhibited.

The cooling water piping system 5 is provided over a chiller (cooling water circulation supply device) 16 outside the housing 2 and the cooling water flow path 10 provided in the heat receiving; cooling unit 11 within the housing 2, and the cooling water is circulated between the chiller 16 and the cooling water flow path 10. The cooling water piping system 5 includes: a piping unit 51 on an inflow side on which the cooling water flows in from the chiller 16 toward the cooling water flow path 10; a piping unit 52 on an outflow side on which the cooling water flows out from the cooling water flow path 10 toward the chiller 16; and a piping unit 53 which makes a portion of the piping unit 51 and a portion of the piping unit 52 communicate with each other.

Although in FIG. 1, the chiller 16 is installed outside the housing 2 of the laser apparatus 1, the chiller 16 may be installed within the housing 2. In FIG. 1, thick solid lines represent the cooling water piping system 5 including the cooling water flow path 10. Arrows shown in the vicinity thereof illustrate directions in which the cooling water flows. Furthermore, solid white arrows schematically represent laser light 17. Specifically, the laser light 17 emitted from the laser oscillator 5 is passed through a laser optical system 18 and is output from the laser apparatus 1.

Within the laser oscillator 3, a temperature detection means 15 is provided which detects the temperature of a predetermined portion of the surrounding member 14. The temperature detection means 15 is formed with, for example, a temperature sensor, and outputs, as a surrounding member temperature, the result of the detection of the temperature of the surrounding member 14 to the control unit 7. Preferably, in order to more reliably prevent dew condensation on the dew condensation prevention target unit 13, the predetermined portion of the surrounding member 14 where the temperature detection means 15 is provided is a portion on the surface of the surrounding member 14 which is in contact with air or a portion in the vicinity of the surface, and is a portion whose temperature is the lowest except a protrusion portion of the surrounding member 14 or a portion whose temperature is close to the temperature of the portion whose temperature is the lowest in a state where the laser apparatus 1 or the laser oscillator 3 is driven under standard driving conditions so as to substantially reach an equilibrium state. The protrusion portion of the surrounding member 14 refers to a portion, such as an attachment flange portion, a tab or the like in the surrounding member 14, which is far away from the dew condensation prevention target unit 13 as compared with the outer wall surface of the surrounding member 14.

The surrounding member 14 is formed such that its temperature is increased as the temperature of the heat generating unit 9 is increased. Specifically, the surrounding member 14 is formed such that a surrounding member equilibrium temperature is higher than the maximum dew point temperature which is assumed with respect to air within the housing 2. The surrounding member equilibrium temperature refers to the temperature of the surrounding member 14 in a state where the laser apparatus 1 or the laser oscillator 3 is driven under the standard driving conditions in which the laser light of a standard optical output is emitted and in which a cooling capacity for cooling the heat receiving/cooling unit 11 with the cooling capacity control means 6 is controlled to have a standard level and where a substantially equilibrium state is reached. The standard optical output may be set to a rated optical output. Although a specific surrounding member equilibrium temperature is not limited, as an example, the surrounding member equilibrium temperature is set 5° C. higher than the maximum dew point temperature.

Examples of a specific means for setting the surrounding member equilibrium temperature of the surrounding member 14 higher than the maximum dew point temperature include a means in which thermal resistance between the surrounding member 14 and the heat receiving/cooling unit 11 is increased such as by a method of interposing a heat insulating plate (unillustrated) in an interface between the surrounding member 14 and the heat receiving/cooling unit 11 and a means in which the inner wall surface of the surrounding member 14 is blackened such that radiant heat from the heat generating unit 9 is easily absorbed. The thermal resistance between the surrounding member 14 and the heat receiving/cooling unit 11 may likewise be increased such as by a method of interposing a heat insulating plate such that the temperature of the vicinity of a portion of the surrounding member 14 which is in contact with the heat receiving/cooling unit 11 is also sufficiently increased as the temperature of the heat generating unit 9 is increased.

The cooling capacity control means 6 is provided on the cooling water piping system 5, and includes, as shown in the figure, three solenoid valves A, B and C that are on-off valves whose opening and closing are controlled by the control unit 7. The solenoid valve A is provided on the downstream side of the connection portion of the piping unit 53 in the piping unit 51 of the cooling water piping system 5. The solenoid valve B is provided on the upstream side of the connection portion of the piping unit 53 in the piping unit 52 of the cooling water piping system 5. The solenoid valve C is provided in the piping unit 53 of the cooling water piping system 5. When the cooling water is supplied from the chiller 16 to the heat receiving/cooling unit 11, the cooling capacity control means 6 is controlled so as to close the solenoid valve C and open the solenoid valve A and the solenoid valve B whereas when the supply of the cooling water from the chiller 16 to the heat receiving/cooling unit 11 is stopped, the cooling capacity control means 6 is controlled so as to open the solenoid valve C and close the solenoid valve A and the solenoid valve B. In this way, the supply and non-supply of the cooling water flowing along the cooling water flow path 10 of the heat receiving/cooling unit 11 are controlled, and consequently, the cooling capacity is controlled.

In the control unit 7, a switching temperature for comparison with the surrounding member temperature detected by the temperature detection means 15 is previously set. The switching temperature is set lower than the surrounding member equilibrium temperature described above. However, in the present embodiment, the switching temperature is set higher than the maximum dew point temperature which is assumed with respect to the air within the housing 2. Although a specific temperature is not limited, as an example, in the case of the above-described example where the surrounding member equilibrium temperature is set 5° C. higher than the maximum dew point temperature, the switching temperature is set 3° C. lower than the surrounding member equilibrium temperature. Hence, when the maximum dew point temperature assumed with respect to the air within the housing 2 is assumed to be 35° C., the surrounding member equilibrium temperature is 40° C., and the switching temperature is 37° C. The switching temperature can be set and input from the input unit 8.

The control unit 7 compares the surrounding member temperature detected by the temperature detection means 15 with the switching temperature at least while outputting a current output command to the laser power supply unit 4. Then, when it is determined that the surrounding member temperature is lower than the switching temperature, the control unit 7 controls the cooling capacity control means 6 so as to close the solenoid valves A and B and open the solenoid valve C and thereby stop the supply of the cooling water from the chiller 16 to the heat receiving/cooling unit 11. In this way, the cooling capacity for cooling the corresponding heat receiving/cooling unit 11 is set lower than the standard level. On the other hand, when it is determined that the surrounding member temperature is higher than the switching temperature, the control unit 7 controls the cooling capacity control means 6 so as to open the solenoid valves A and B and close the solenoid valve C and thereby supply the cooling water from the chiller 16 to the heat receiving/cooling unit 11. In this way, the cooling capacity for cooling the corresponding heat receiving cooling unit 11 is set to the standard level.

Figure 2:
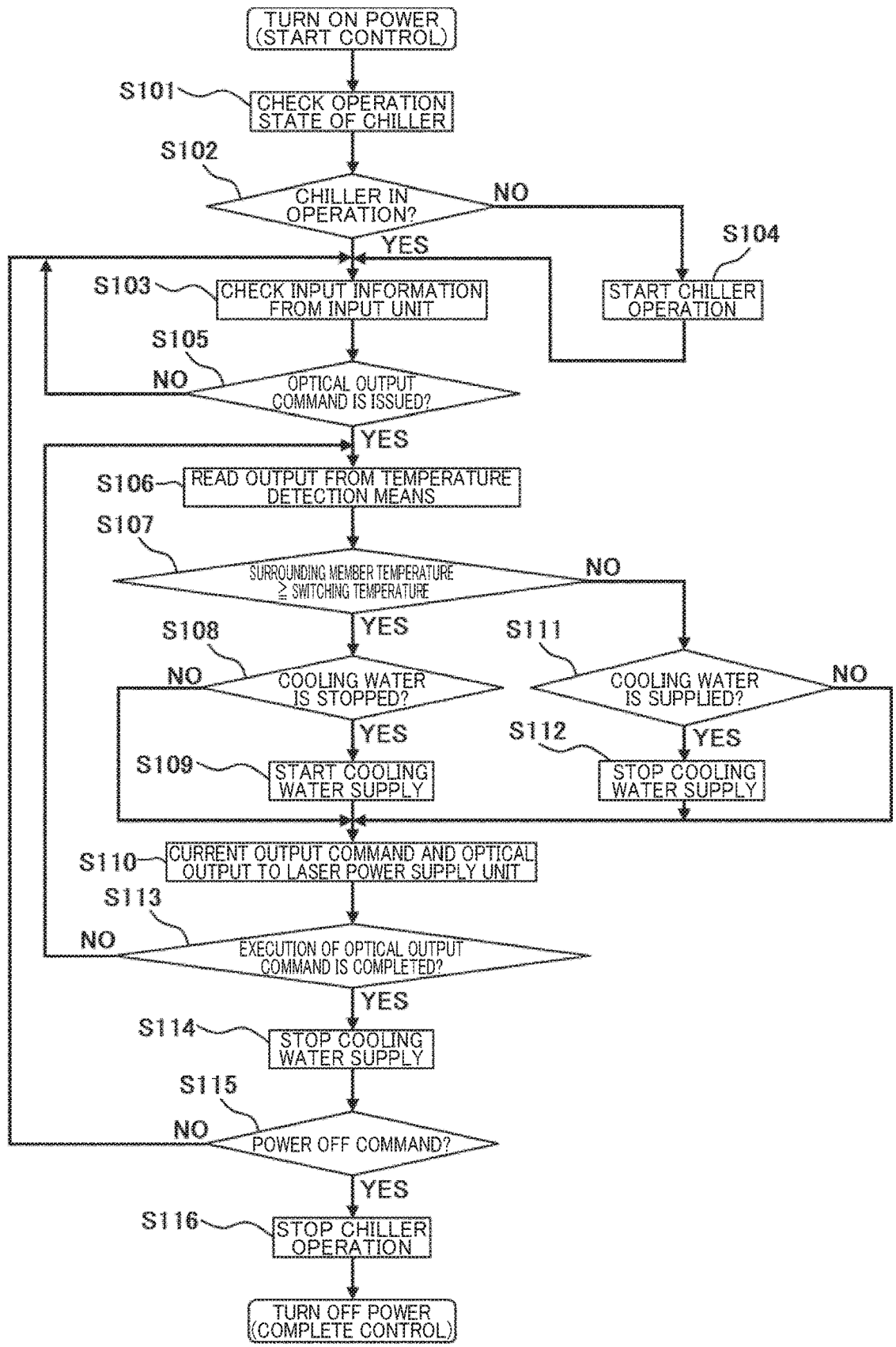
FIG. 2 is a flowchart showing an example of control in the laser apparatus according to the first embodiment of the present invention.

FIG. 2 is a flowchart showing an example of control in the laser apparatus 1 described in the present embodiment. Based on this, the control in the laser apparatus 1 will be described. When the power of the laser apparatus 1 is turned on, and the control is started, the control unit 7 first checks the operation state of the chiller 16 (step S101) so as to determine whether or not the chiller 16 is operated (step S102). Here, when the chiller 16 is operated (in the case of YES), the control unit 7 checks information input from the input unit 8 (step S103). When in the determination of step S102, the chiller 16 is not operated (in the case of NO), the control unit 7 starts the operation of the chiller 16 (step S104). Thereafter, the flow proceeds to step S103.

In step S103, the control unit 7 checks the information input from the input unit 8. The control unit 7 determines, from the result thereof, whether or not an optical output command is issued to the laser apparatus 1 (step S105). Here, when it is determined that the optical output command is not issued to the laser apparatus 1 (in the case of NO), the flow returns to step S103. When it is determined that the optical output command is issued to the laser apparatus 1 (in the case of YES), the control unit 7 reads an output (temperature detection value) from the temperature detection means 15 (step S106) and compares the surrounding member temperature detected by the temperature detection means 15 with the switching temperature so as to determine whether or not the surrounding member temperature is equal to or more than the switching temperature (step S107).

When in step S107, it is determined that the surrounding member temperature is higher than the switching temperature (in the case of YES), the control unit 7 determines whether or not the supply of the cooling water from the chiller 16 to the heat receiving/cooling unit 11 is stopped (step S108). Here, when it is determined that the supply of the cooling water is stopped (in the case of YES), the control unit 7 controls the cooling capacity control means 6 so as to start the supply of the cooling water (step S109). Then, the control unit 7 outputs the current output command corresponding to the optical output command to the laser power supply unit 4. In this way, the laser oscillation of the laser oscillator 3 is performed by the driving current supplied from the laser power supply, and thus the laser right is emitted from the laser apparatus 1 (step S110).

When in step S108, it is determined that the supply of the cooling water from the chiller 16 to the heat receiving/cooling unit 11 is not stopped (in the case of NO), the flow directly proceeds to step S110. When in step S107, it is determined that the surrounding member temperature is lower than the switching temperature (in the case of NO), the control unit 7 determines whether or not the cooling water is supplied from the chiller 16 to the heat receiving/cooling unit 11 (step S111). Here, when it is determined that the cooling water is supplied (in the case of YES), the control unit 7 controls the cooling capacity control means 6 so as to stop the supply of the cooling water (step S112). Then, the flow proceeds to step S110. When in step S111, it is determined that the cooling water is not supplied from the chiller 16 to the heat receiving/cooling unit 11 (in the case of NO), the flow also proceeds to step S110.

While the laser light is being emitted in step S110, the control unit 7 constantly determines whether or not the execution of the optical output command is completed (step S113). Here, when it is determined that the execution of the optical output command is not completed (in the case of NO), the flow returns to step S106, and the control unit 7 checks the surrounding member temperature. When it is determined that the execution of the optical output command is completed (in the case of YES), the control unit 7 controls the cooling capacity control means 6 so as to stop the supply of the cooling water from the chiller 16 to the heat receiving/cooling unit 11 (step S114), and then determines whether or not a power-off command is issued from the input unit 8 (step S115). Here, when it is determined that the power-off command is not issued (in the case of NO), the flow returns to step S103, and the control unit 7 waits for an input of the subsequent optical output command. When it is determined that the power-off command is issued (in the case of YES), the control unit 7 controls the cooling capacity control means 6 so as to stop the operation of the chiller 16 (step S116), and finally turns off the power of the laser apparatus 1.

With respect to a case where in the control of the laser apparatus 1, the optical output command that the power of the laser apparatus 1 is turned on so as to produce the standard optical output continuously for a fixed period, that an optical output of 50% of the standard optical output is produced again continuously for a fixed period and that the optical output is thereafter completed is input from the input unit 8, the specific control flow will be described below. When the power of the laser apparatus 1 is turned on such that the control is started, the control unit 7 first checks the operation state of the chiller 16 (step S101). Here, since the chiller 16 is stopped, the control unit 7 starts the operation of the chiller 16 (step S104), and checks the information input from the input unit 8 (step S103). Here, since it is determined that the optical output command is issued, the control unit 7 reads the output from the temperature detection means 15 (step S106) so as to determine whether or not the surrounding member temperature is equal to or more than the switching temperature (step S107).

At the beginning of the control, the laser light is not output, and thus the heat generating unit 9 has not generated heat yet. Hence, in step S107, it is determined that the surrounding member temperature is lower than the switching temperature, and then in step S111, whether or not the cooling water is supplied from the chiller 16 to the heat receiving/cooling unit 11 is determined. At the beginning of the control, since the cooling water is not supplied, the current output command corresponding to the optical output command that the standard optical output is continuously produced in a state where the cooling water is not supplied is output from the control unit 7 to the laser power supply unit 4, and thus the laser light is output (step S110). While the laser light is being emitted, the control unit 7 determines whether or not the execution of the optical output command is completed (step S113). Until the completion of the execution of the output command, the flow returns to step S106, and the control unit 7 reads an output from the temperature detection means 15.

For a while, a loop from step S106 to step S107 to step S111 to step S110 to step S113 and then to step S106 is repeated. When the standard optical output is continuously produced, then as the temperature of the heat generating unit 9 is increased, the surrounding member temperature is increased, with the result that the surrounding member temperature reaches the switching temperature (in the example described above, 37° C.). In this way, in step S107, it determined that the surrounding member temperature is equal to or more than the switching temperature, the flow proceeds to step S108 and whether or not the supply of the cooling water from the chiller 16 to the heat receiving/cooling unit 11 is started is determined. Here, since the supply of the cooling water has not been started yet, the supply of the cooling water is started for the first time here (step S109).

Since the cooling water has not so far been supplied to the heat receiving/cooling unit 11, dew condensation does not occur on the dew condensation prevention target unit 13. The surrounding member temperature is lower than the surrounding member equilibrium temperature (in the example described above, 40° C.) when the laser apparatus 1 is driven under the standard driving conditions so as to reach equilibrium. Hence, the temperature of the heat generating unit 9 is also lower than the temperature when the laser apparatus 1 is driven under the standard driving conditions so as to reach equilibrium, and thus the lifetime consumption of the heat generating unit 9 is prevented from being accelerated as compared with the case where the laser apparatus 1 is driven under the standard driving conditions.

Thereafter, through step S110 and S113, the flow returns to step S106, and while the standard optical output is being produced, a loop from step S106 to step S107 to step S108 to step S110 to step S113 and then to step S106 is repeated. The surrounding member temperature is increased from the switching temperature (in the example described above, 37° C.) to the surrounding member equilibrium temperature (in the example described above, 40° C.) so as to reach equilibrium, and is thereby prevented from being lowered beyond the maximum dew point temperature (in the example described above, 35° C.) assumed with respect to the air within the housing 2, with the result that dew condensation is prevented from occurring on the dew condensation prevention target unit 13. Hence, a problem is prevented from occurring in which in step S107, the surrounding member temperature is determined to be lower than the switching temperature such that the supply of the cooling water is stopped, and in which thus the temperature of the heat generating unit 9 is higher than the temperature when the laser apparatus 1 is driven under the standard driving conditions such that the lifetime consumption of the heat generating unit 9 is accelerated by the temperature of the heat generating unit 9.

Then, when the details of the optical output command are changed to a command to produce an optical output of 50% of the standard optical output continuously for a fixed period, the amount of heat generation in the heat generating unit 9 is reduced and thus the temperature of the heat generating unit 9 is lowered and the temperature of the surrounding member 14 is also lowered. In this way, when in step S101, it is determined that the surrounding member temperature is lower than the switching temperature, in step S111, it is determined that the cooling water is being supplied to the heat receiving/cooling unit 11. Thereafter, the supply of the cooling water from the chiller 16 is stopped (step S112).

When the supply of the cooling water is stopped, the temperature of the heat receiving/cooling unit 11 is increased, and thus the temperature of the heat generating unit 9 and the surrounding member temperature are also increased. In this way, in step S107, it is determined that the surrounding member temperature is equal to or more than the switching temperature, and then in step S108, it is determined that the supply of the cooling water is stopped, with the result that the step (step S109) of starting the supply of the cooling water again is repeated. Consequently, the surrounding member temperature is controlled to substantially agree with the switching temperature (in the example described above, 37° C.), and thus the surrounding member temperature is prevented from being lowered beyond the maximum dew point temperature (in the example described above, 35° C.) assumed with respect to the air within the housing 2. Hence, dew condensation is prevented from occurring on the dew condensation prevention target unit 13. Since the surrounding member temperature is lower than the surrounding member equilibrium temperature, the temperature of the heat generating unit 9 is lower than at least the temperature when the laser apparatus 1 is driven under the standard driving conditions, and as compared with the case where the laser apparatus 1 is driven under the standard driving conditions, the lifetime consumption of the heat generating unit 9 is prevented from being accelerated by the temperature of the heat generating unit 9.

When in step S113, it is determined that the execution of the optical output command is completed, the control unit 7 stops the supply of the cooling water from the chiller 16 to the heat receiving/cooling unit 11 (step S114), and then determines whether or not the power-off command is issued (step S115). When it is determined that the power-off command is issued, the operation of the chiller 16 is stopped (step S116), and the power of the laser apparatus 1 is finally turned off.

Since the supply of the cooling water from the chiller 16 to the heat receiving/cooling unit 11 is stopped immediately after it is determined that the execution of the optical output command is completed, the temperatures of the surrounding member 14 and the dew condensation prevention target unit 13 are relatively slowly lowered by the thermal capacities of the heat receiving/cooling unit 11 and the like. Hence, the temperatures of the cooling water piping system 5 and the like other than the cooling water flow path 10 are lower, and thus dew condensation does not occur on the surrounding member 14 and the dew condensation prevention target unit 13.

As described above, in the laser apparatus 1 of the present embodiment, even when a dehumidifier is not provided, control is performed according to steps S101 to S116 in the flowchart, and thus it is possible to prevent dew condensation on the dew condensation prevention target unit 13 including the heat generating unit 9 without the lifetime consumption of the heat generating unit 9 being accelerated by an increase in temperature of the heat generating unit 9 beyond the temperature of the heat generating unit 9 under the standard driving conditions, even in a case where an optical output lower than the standard optical output is commanded.

Figure 3:
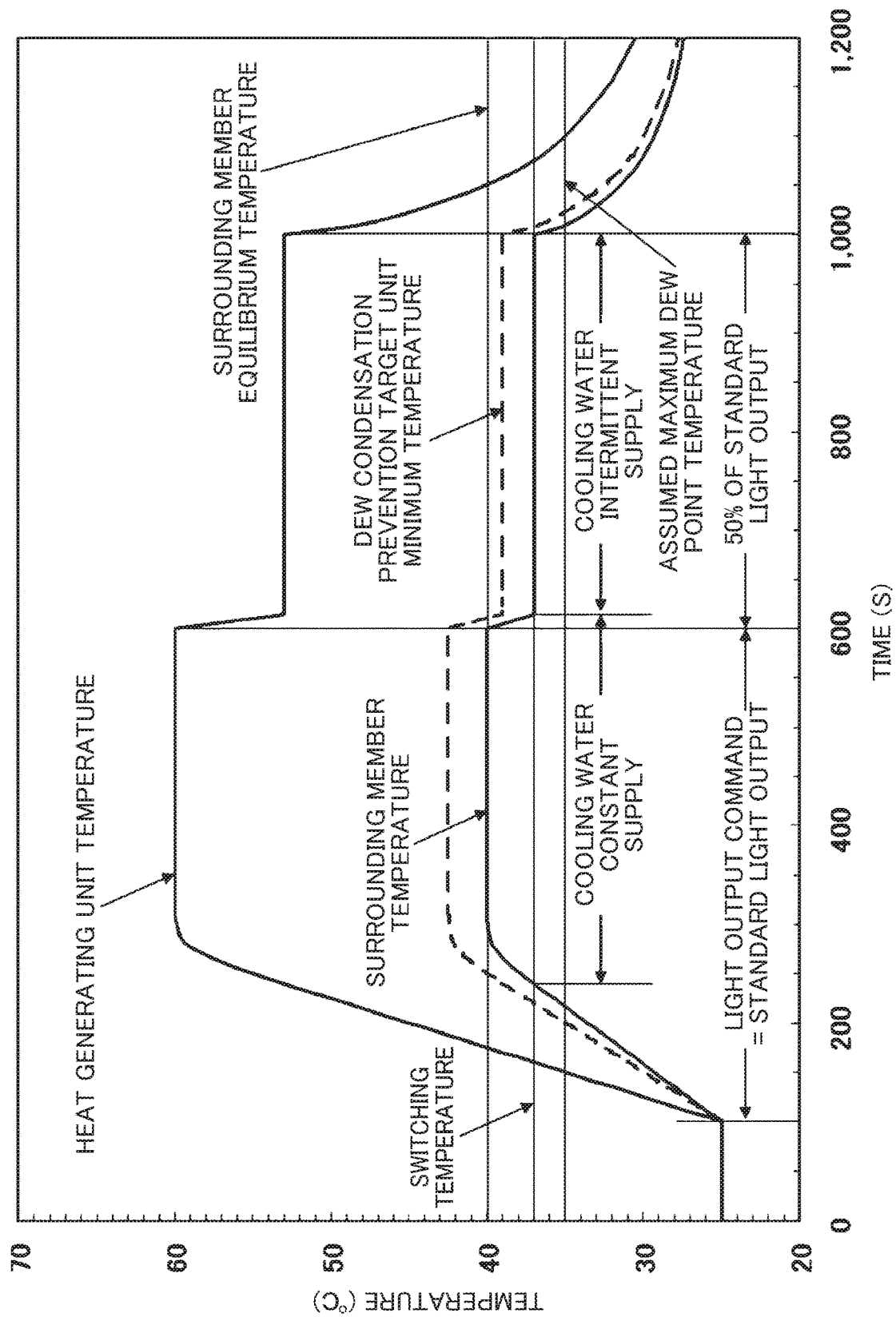
FIG. 3 is a time chart showing the flow of the control in the laser apparatus according to the first embodiment of the present invention.

FIG. 3 is a time chart showing the flow of the specific control described above. FIG. 3 shows a case where an optical output command that the standard optical output is produced for 500 seconds and that thereafter an optical output of 50% of the standard optical output is produced for 400 seconds is input from the input unit. During a period in which the surrounding member temperature is higher than the switching temperature, the cooling water is supplied from the chiller 16 to the heat receiving/cooling unit 11 continuously and constantly. When the surrounding member temperature is lowered beyond the switching temperature, the supply of the cooling water is stopped. However, since the supply of the cooling water is started again when the surrounding member temperature is increased up to the switching temperature by the stop of the supply of the cooling water, the supply of the cooling water is intermittently performed. During a period in which the intermittent supply of the cooling water is performed, the surrounding member temperature is kept at approximately the switching temperature.

Even when the cooling water is intermittently supplied, the temperatures of the surrounding member 14 and the heat generating unit 9 are not changed rapidly by the thermal capacities of the heat receiving/cooling unit 11 and the like. However, the temperature at which the water supply is stopped may be set slightly lower than the temperature at which the water supply is started so that the water supply and the stop of the water supply are prevented from being frequently repeated.

Instead of the intermittent switching of the supply of the cooling water with the solenoid valves A, B and C, the cooling capacity control means 6 may use, for example, as the solenoid valve A shown in FIG. 1, not the on-off valve but a flow rate adjustment valve which can adjust the flow rate. When the flow rate adjustment valve is used, during the period of the intermittent supply of the cooling water in FIG. 3, the control unit 7 adjusts the flow rate of the cooling water flowing along the piping unit 51 so as to reduce the amount of cooling water supplied to the heat receiving/cooling unit 11, and thereby can control the surrounding member temperature such that the surrounding member temperature is around the switching temperature. Moreover, when the flow rate adjustment valve is used, the control unit 7 controls the rate of variation in the flow rate, and thereby can perform control so as to reduce the application of stress to the piping system caused by a rapid variation in the flow rate and the application of unnecessary vibration and impact to the LD module and the LD chip. In the cooling capacity control means 6, instead of the solenoid valves A, B and C, only the flow rate adjustment valve may be provided.

As the control on the cooling capacity of the cooling capacity control means 6, another type of control in which the temperature of the cooling water supplied from the chiller 16 is changed can be considered. However, since it is disadvantageously difficult to rapidly change the cooling capacity due to the thermal capacity of the cooling water, it is preferable to control the flow rate of the cooling water with a flow rate control means such as the on-off valves or the flow rate adjustment valve.

Second Embodiment

Figure 4:
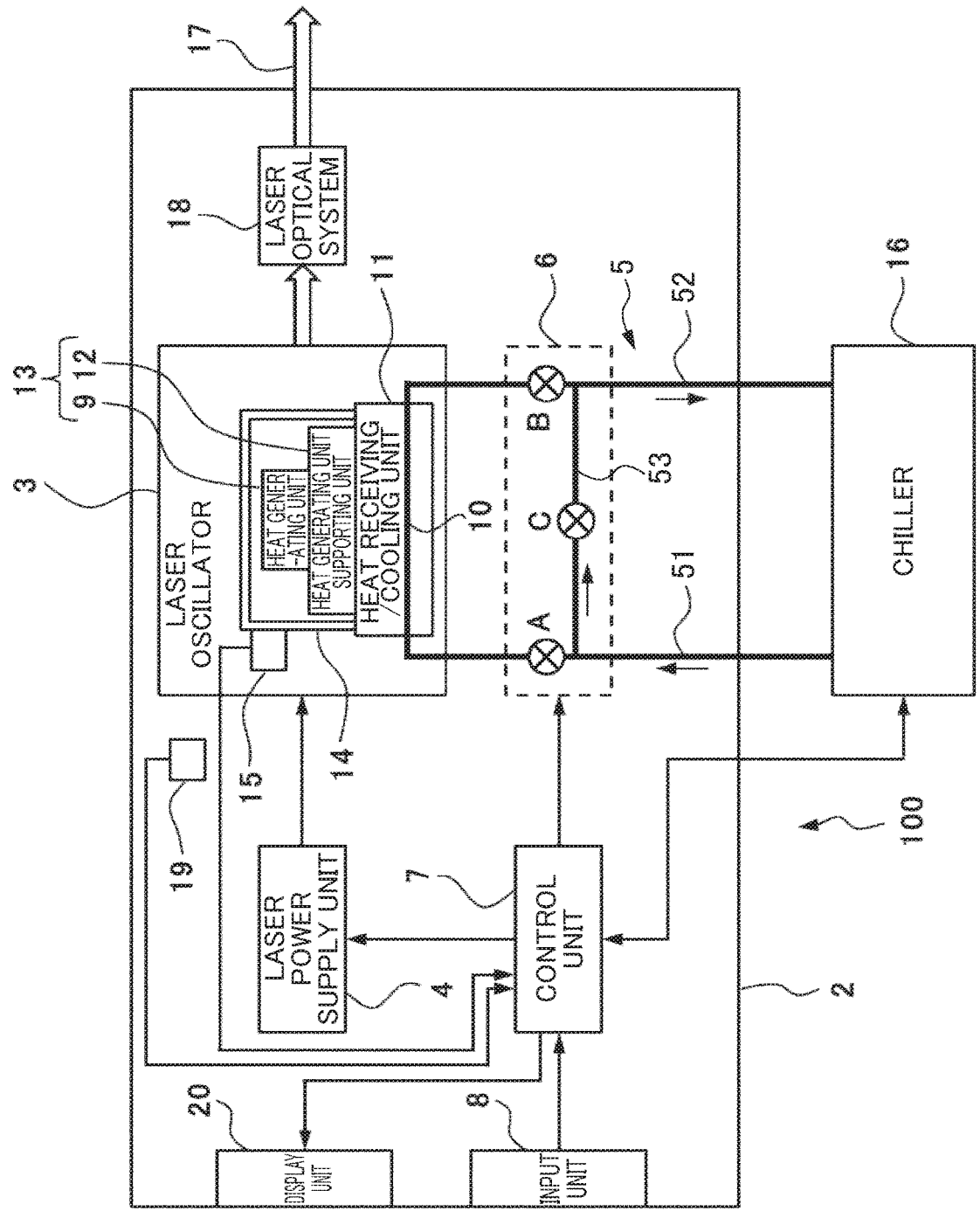
FIG. 4 is a block diagram showing a conceptual configuration of a laser apparatus according to a second embodiment of the present invention.

FIG. 4 is a block diagram showing a conceptual configuration of a laser apparatus 100 according to a second embodiment of the present invention. The laser apparatus 100 shown in FIG. 4 differs from the laser apparatus 1 shown in FIG. 1 in that a dew point temperature detection means 19 for detecting the dew point temperature of the air within the housing 2 and a display unit 20 for displaying a determination result, a warning or the like are added.

The dew point temperature detection means 19 is formed with, for example, a dew point temperature sensor, and outputs a dew point temperature detection value of the air within the housing 2 to the control unit 7. Although in FIG. 4, the dew point temperature detection means 19 is installed outside the laser oscillator 3, in order to detect the dew point temperature of air in a position close to the dew condensation prevention target unit 13, the dew point temperature detection means 19 may be installed within the laser oscillator 3 or one or more dew point temperature detection means 19 may be installed both inside and outside the laser oscillator 3 such that it is possible to monitor the deterioration or the like of the detection property of the dew point temperature detection means 19. The dew point temperature detection means 19 may be formed with a temperature detector, a humidity detector, a calculation unit for calculating a dew point temperature from the temperature and the humidity and the like.

Unlike the first embodiment, the switching temperature of the present embodiment is set to a value obtained by adding a predetermined temperature to the dew point temperature of the air within the housing 2 detected by the dew point temperature detection means 19. The predetermined temperature is a positive or negative temperature which includes 0° C. Specifically, the predetermined temperature may be set to a positive temperature including a margin or may be set to a negative temperature with consideration given to the fact that as described previously, the lowest temperature of the dew condensation prevention target unit 13 is generally higher than the temperature of the surrounding member 14.

Figure 5:
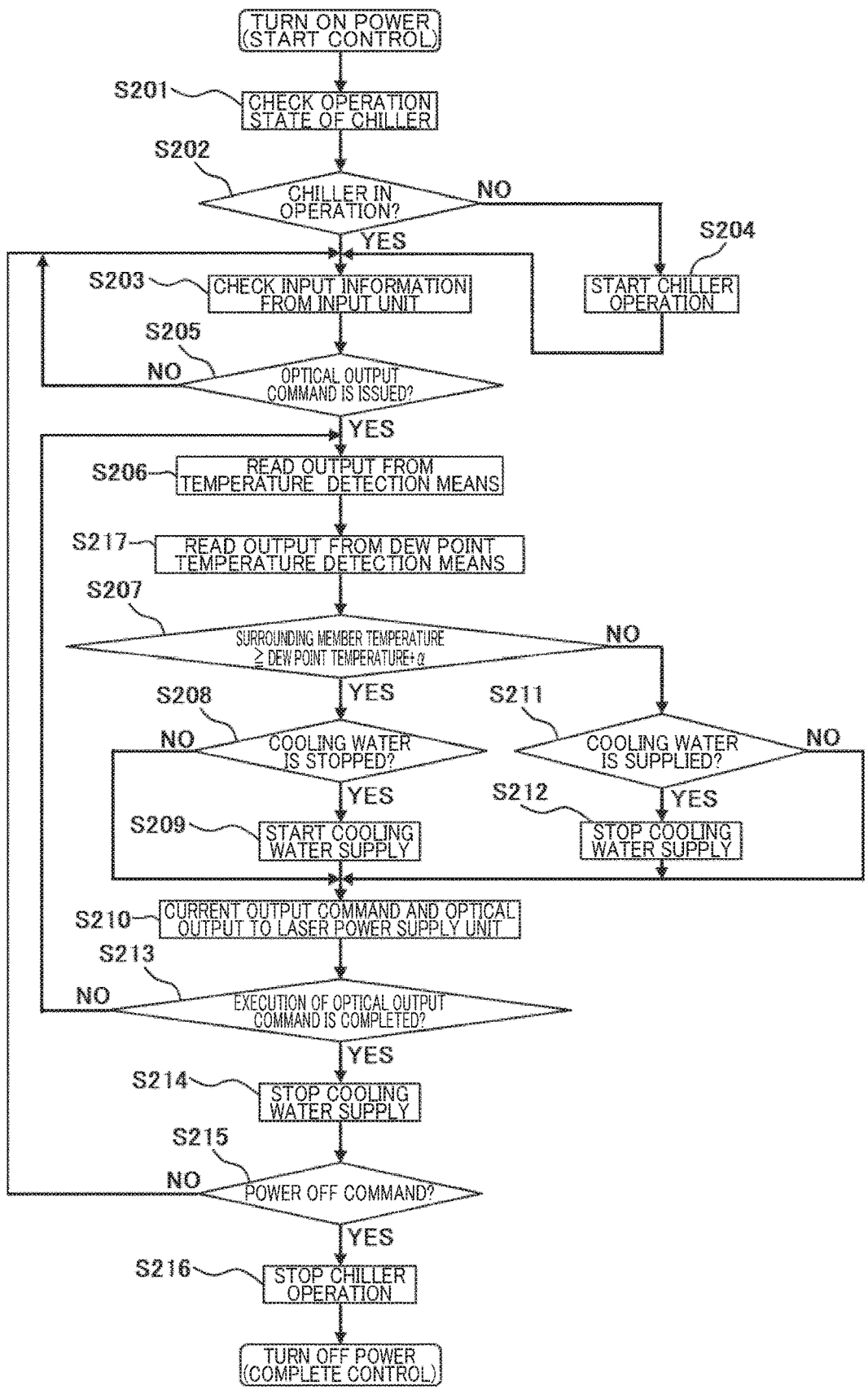
FIG. 5 is a flowchart showing an example of control in the laser apparatus according to the second embodiment of the present invention.

FIG. 5 is a flowchart showing an example of control in the laser apparatus 100 of the present embodiment. The flowchart shown in FIG. 5 differs from the flowchart shown in FIG. 2 in that after the reading of an output from the temperature detection means 15 (step S206), the reading of an output from the dew point temperature detection means 19 (step S217) is added and in that in the flowchart shown in FIG. 2, in step S107, the control unit 7 compares the surrounding member temperature and the switching temperature whereas in the flowchart shown in FIG. 5, in step S207, the control unit 7 compares the surrounding member temperature and a temperature obtained by adding the predetermined temperature to the dew point temperature detected by the dew point temperature detection means 19.

In step S207, the predetermined temperature is represented by α for shortening of the term. In step S207, whether or not the surrounding member temperature is equal to or more than the dew point temperature plus the predetermined temperature is determined. When the surrounding member temperature is higher than the dew point temperature plus the predetermined temperature (in the case of YES), the cooling water is supplied from the chiller 16 to the heat receiving/cooling unit 11 whereas when the surrounding member temperature is lower than the dew point temperature plus the predetermined temperature (in the case of NO), the supply of the cooling water from the chiller 16 to the heat receiving/cooling unit 11 is stopped.

Figure 6:
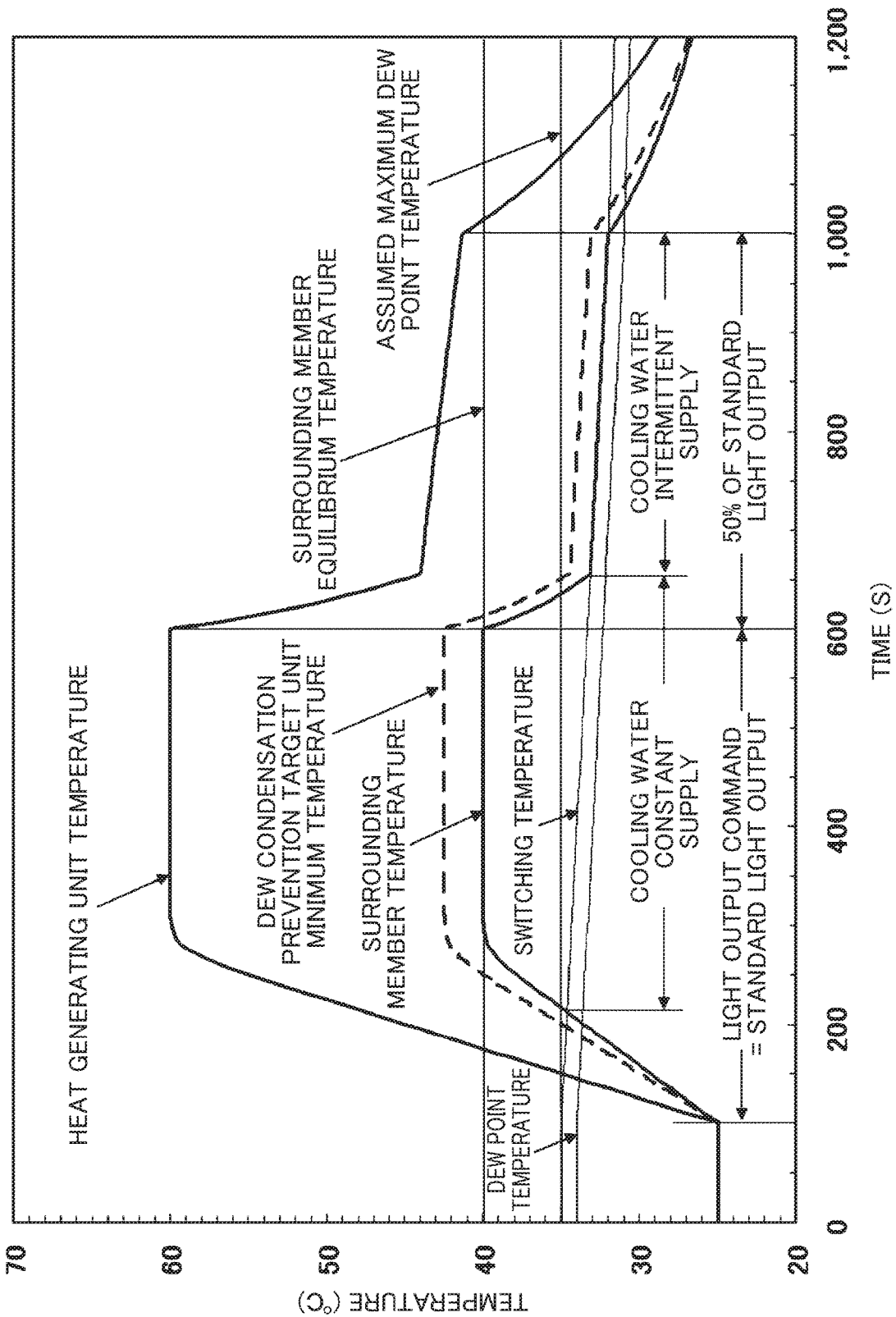
FIG. 6 is a time chart showing the flow of the control in the laser apparatus according to the second embodiment of the present invention.

FIG. 6 is a time chart showing the flow of the control in the present embodiment. As in FIG. 3, FIG. 6 shows the case where the optical output command that the standard optical output is produced for 500 seconds and that thereafter the optical output of 50% of the standard optical output is produced for 400 seconds is input from the input unit 8. FIG. 6 differs from FIG. 3 in that the dew point temperature within the housing 2 detected by the dew point temperature detection means 19 is added. Here, the predetermined temperature is set to 1° C., and thus the dew point temperature plus 1° C. is set to the switching temperature.

As in the case of FIG. 3, during the period in which the surrounding member temperature is hither than the switching temperature, the cooling water is supplied from the chiller 16 to the heat receiving/cooling unit 11 continuously and constantly. When the surrounding member temperature is lowered beyond the switching temperature, the supply of the cooling water is stopped. However, when the surrounding member temperature is increased up to the switching temperature by the stop of the supply of the cooling water, the supply of the cooling water is started again. Hence, the supply of the cooling water is intermittently performed. During a period in which the intermittent supply of the cooling water is performed, the surrounding member temperature is kept at approximately the switching temperature.

In an example shown in FIG. 6, a case where the dew point temperature is lowered from 34° C. to 31° C. for 900 seconds is shown. In this way, the switching temperature is lowered from 35° C. to 32° C. Hence, although the temperatures of the heat generating unit 9 and the surrounding member temperature during a period in which the optical output command is a command to produce the standard optical output are not changed from the case shown in FIG. 3, when a period is entered in which the optical output command is a command to produce an output of 50% of the standard optical output, the surrounding member temperature is lowered only by a temperature corresponding to a decrease in the switching temperature, and the temperature of the heat generating unit 9 is also lowered as compared with the case of FIG. 3. During the period of the intermittent supply of the cooling water, a ratio of the time in which the cooling water is supplied to the heat receiving/cooling unit 11 is increased, and thus the temperature is lowered as compared with the case of FIG. 3.

As described above, even in the first embodiment, during a period in which the optical output command is a command to produce an output lower than the standard optical output, the temperature of the heat generating unit 9 is lower than the temperature when the laser apparatus 1 is driven under the standard driving conditions, and thus the lifetime consumption of the heat generating unit 9 is decelerated whereas in the second embodiment, when the actual dewy point temperature is lower than the assumed maximum dew point temperature, the deceleration of the lifetime consumption of the heat generating unit 9 when the optical output command is a command to produce an output lower than the standard optical output is further increased.

As is understood from the description of the embodiments discussed above, when the maximum dew point temperature assumed with respect to the air within the housing 2 is set to a surrounding upper limit dew point temperature Which is the upper limit of a dew point temperature of around the laser apparatus 100 derived from the allowable installation environment condition of the laser apparatus 100 or an installation condition specification of the laser apparatus 100, even if the degree of the enclosing of the housing 2 is low such that air having the highest dew point temperature within an installation condition specification range infiltrates from the outside of the laser apparatus 100 into the housing 2 in a significant proportion, it is possible to prevent the occurrence of dew condensation on the surface of the surrounding member 14 and the dew condensation prevention target unit 13.

As a variation of the second embodiment, when the dew point temperature within the housing 2 detected by the dew point temperature detection means 19 is higher than the surrounding upper limit dew point temperature which is the upper limit of the dew point temperature of the air around the laser apparatus 100 derived from the allowable installation environment condition of the laser apparatus 100 or the installation condition specification of the laser apparatus 100, a notification that the installation environment of the laser apparatus 100 falls outside the range of the installation condition specification may be provided by the display unit 20. The display unit 20 is a notification means which provides a notification visually or auditorily. A specific notification method is not particularly limited but examples thereof include a display on a monitor screen, a voice warning and the blinking of a warning lamp. The display unit 20 is controlled by the control unit 7.

When a notification is provided by the display unit 20, for example, in step S217 of the flowchart shown in FIG. 5, after the reading of an output from the dew point temperature detection means 19, a step is preferably added that determines whether or not the dew point temperature of the air within the housing 2 is lower than the surrounding upper limit dew point temperature which is the upper limit of the dew point temperature of the air around the laser apparatus 100 derived from the allowable installation environment condition of the laser apparatus 100 or the installation condition specification of the laser apparatus 100. When the dew point temperature of the air within the housing 2 is higher than the surrounding upper limit dew point temperature, the control unit 7 can produce, on the display unit 20, a caution display such as "The installation environment of the laser apparatus falls outside the specification range such that the dew point temperature is increased. Please check and improve the installation environment". Furthermore, when such a state continues, it is possible to produce a warning display such as "The installation environment of the laser apparatus falls outside the specification range such that the dew point temperature is increased. Laser oscillation will be stopped in 10 minutes for protecting the laser apparatus". Together with the caution display and the warning display, by a sounding an alarm, the blinking of a warning lamp and the like, the caution and the warning may be prevented from being overlooked. In order to more accurately check the installation environment of the laser apparatus 100, a dew point temperature detection means which directly detects the dew point temperature outside the laser apparatus 100 may be further added.

As described above, in the second embodiment, even if for some reason, the dew point temperature of the air within the housing 2 exceeds the maximum dew point temperature assumed with respect to the air within the housing 2, it is possible to prevent the occurrence of dew condensation on the dew condensation prevention target unit 13.

Third Embodiment

Figure 7:
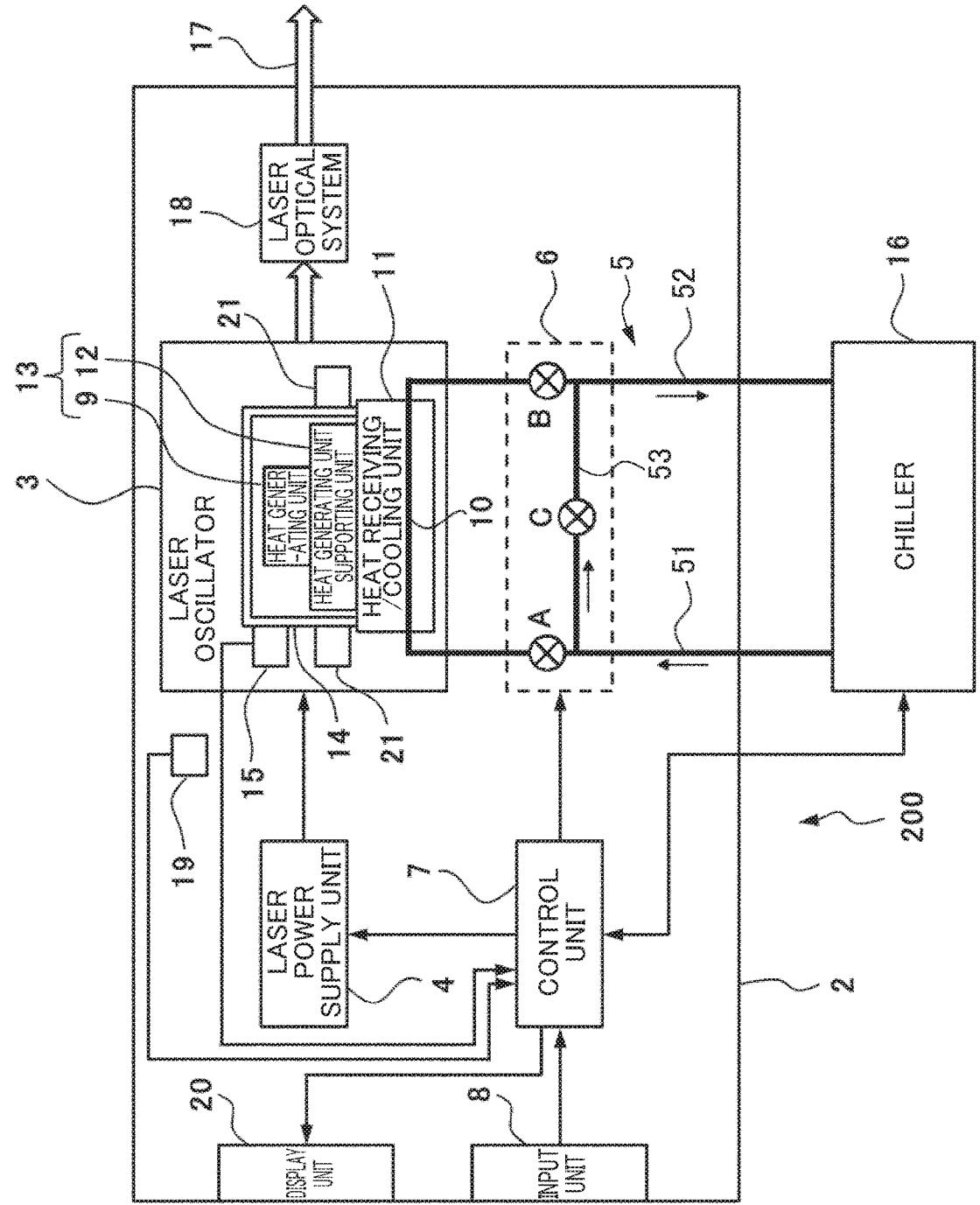
FIG. 7 is a block diagram showing a conceptual configuration of a laser apparatus according to a third embodiment of the present invention.

FIG. 7 is a block diagram showing a conceptual configuration of a laser apparatus 200 according to a third embodiment of the present invention. The laser apparatus 200 shown in FIG. 7 differs from the laser apparatus 100 shown in FIG. 4 in that an auxiliary heating means 21 which is thermally connected to the surrounding member 14 is installed. The auxiliary heating means 21 of the present embodiment is formed with, for example, a heater which generates heat by being energized, is formed in the shape of a frame surrounding the periphery of the surrounding member 14 and is provided in a position close to the heat receiving/cooling unit 11 so as to be in contact with the surrounding member 14. However, the shape and the installation position of the auxiliary heating means 21 are not limited to the present embodiment.

A method of controlling the amount of heat generation in the auxiliary heating means is also not limited. As the simplest control, the auxiliary heating means 21 may only be formed so as to keep a constant amount of heat generation. In such a case, the temperature of a portion of the surrounding member 14 where the auxiliary heating means 21 is installed is kept by the heat generating of the auxiliary heating means 21 at a temperature which is higher only by a temperature calculated from the product of the amount of heat generation in the auxiliary heating means 21 and thermal resistance from the auxiliary heating means 21 up to the heat receiving/cooling unit 11.

In the first embodiment, in order for the surrounding member equilibrium temperature of the surrounding member 14 to be higher than the maximum dew point temperature, for example, a configuration in which the thermal resistance between the surrounding member 14 and the heat receiving/cooling unit 11 is increased is adopted or a method of blackening the inner wall surface of the surrounding member 14 is performed. However, in the present embodiment, it is not always necessary to perform such a method, and even when the temperature of the surrounding member 14 is unlikely to be increased as the temperature of the heat generating unit 9 is increased such that it is difficult to make the surrounding member equilibrium temperature of the surrounding member 14 higher than the maximum dewy point temperature, it is possible to easily make the surrounding member equilibrium temperature higher than the maximum dew point temperature by use of the auxiliary heating means 21.

Although a period in which the auxiliary heating means 21 is made to generate heat may be set to only a period in which the cooling water is supplied to the heat receiving; cooling unit 11 continuously or intermittently, the auxiliary heating means 21 may also be made to generate heat during a period in which the supply of the cooling water to the heat receiving/cooling unit 11 is stopped or the auxiliary heating means 21 may be constantly made to generate heat, except a time when the laser apparatus 200 is completely stopped, including a period in which the laser oscillation is not performed. In this way, it is possible to more reliably avoid a risk of the occurrence of dew condensation on the surrounding member 14 and the dew condensation prevention target unit 13 because the dew point temperature of the air within the housing 2 is significantly high even in a state where the supply of the cooling water to the heat receiving/cooling unit 11 is stopped. Slightly increasing the temperatures of the surrounding member 14 and the dew condensation prevention target unit 13 even when the laser oscillation is not performed as described above may be realized by a method of constantly passing a current which is lower than a threshold current for starting the laser oscillation in the laser oscillator 3.

Although it is not necessarily easy to perform dehumidification at low cost in order to prevent the occurrence of dew condensation, heating is easily performed at low cost as compared with dehumidification. As described above, by performing heating with the auxiliary heating means 21, it is possible to reliably prevent the occurrence of dew condensation on the dew condensation prevention target unit 13.

That the temperature of the surrounding member 14 is unlikely to be increased as the temperature of the heat generating unit 9 is increased means that the thermal resistance between the surrounding member 14 and the heat generating unit 9 is high. Hence, even if the temperature of the surrounding member 14 is slightly increased with the auxiliary heating means 21, only a small thermal influence is exerted on the heat generating unit 9. Hence, the temperature of the heat generating unit 9 is hardly increased, and thus the lifetime consumption of the heat generating unit 9 is prevented from being accelerated.

Although in the embodiments described above, the heat generating unit, which is cooled with the cooling water is indicated as the heat generating unit 9 within the laser oscillator 3, the heat generating unit which is cooled with the cooling water may be a heat generating unit within the laser power supply unit 4.

Fourth Embodiment

Figure 8:
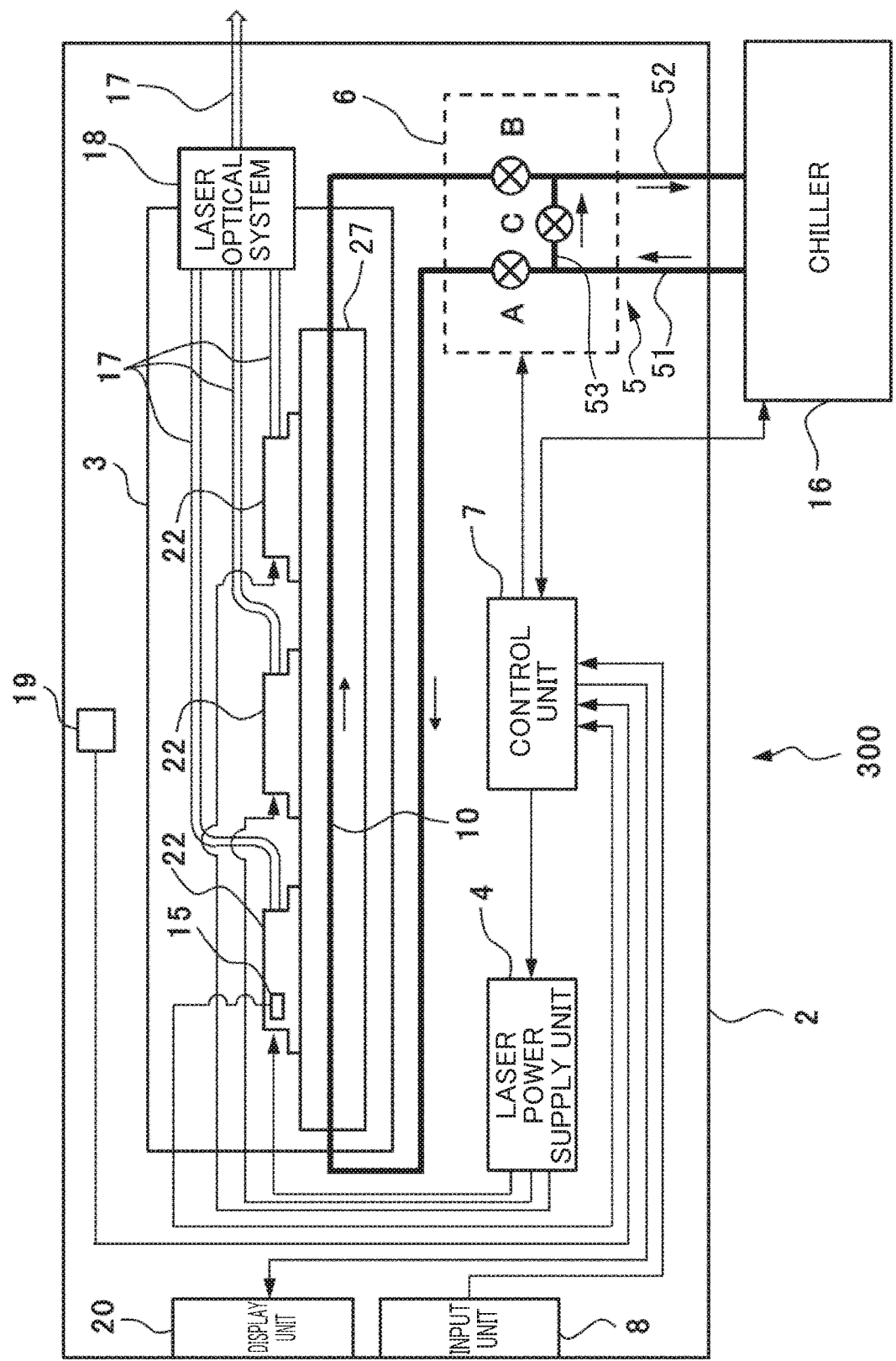
FIG. 8 is a block diagram showing a conceptual configuration of a laser apparatus according to a fourth embodiment of the present invention.
Figure 9:
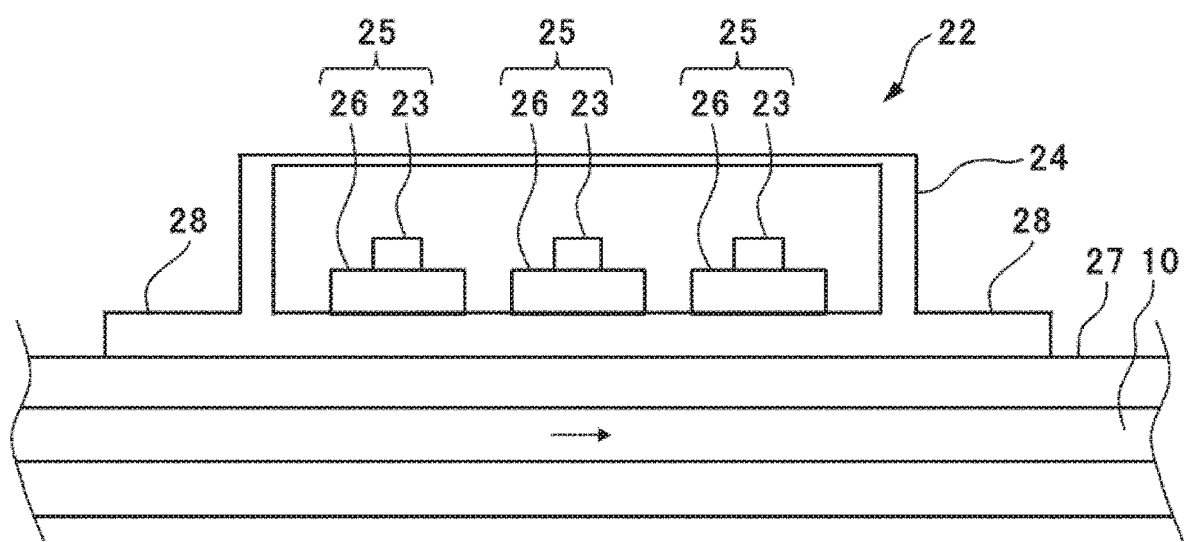
FIG. 9 is a schematic cross-sectional view of an LD module which forms the laser apparatus according to the fourth embodiment of the present invention.

FIG. 8 is a block diagram showing a conceptual configuration of a laser apparatus 300 according to a fourth embodiment of the present invention. FIG. 9 is a diagram schematically showing a cross section of an LD module 22 among a plurality of LD modules 22 shown in FIG. 8. In the laser apparatus 300 described in the present embodiment, the laser oscillator is a laser oscillator 3 in which the LD modules 22 are a light emission source or an excitation light source. The heat generating unit is a laser diode chip (LD chip) 23 which is one of the constituent elements of the LD module 22. The surrounding member is a package 24 which is one of the constituent elements of the LD module 22. The dew condensation prevention target unit is an LDCOS (LD chip on substrate) 25 which includes the LD chip 23. The substrate 26 of the LD chip 23 corresponds to the heat generating unit supporting unit 12. As the heat receiving/cooling unit 11, a plate-shaped cooling plate 27 is provided. The cooling water flow path 10 is provided in the front surface of the cooling plate 27 or therewithin. Within the LD module 22, a plurality of LDCOSs 25 are arranged.

As shown in FIG. 8, in the present embodiment, a plurality of LD modules 22 are arranged so as to be thermally connected to the cooling plate 27. Although a method of fixing the LD module 22 is not illustrated, for example, the LD module 22 is fixed to the cooling plate 27 such as by a method of screwing the LD module 22 with a hole provided in the tab 28 of the package 24 and a screw hole provided in the corresponding position of the cooling plate 27.

Although in FIG. 8, the LD modules 22 are arranged one-dimensionally on the cooling plate 27 in only one row, the LD modules 22 can be naturally arranged two-dimensionally on the cooling plate 27 in a plurality of rows. Since it is possible to collectively cool, with the cooling plate 27, a plurality of LD modules 22, a high-optical output laser oscillator 3 can be realized, a rapid change in the temperature of the LD chip 23 such as the overshooting of the temperature of the LD chip 23 caused by a rapid increase in the amount of heat generation in the LD chip 23 is reduced by the thermal capacity of the cooling plate 27 and thus it is possible to reduce temperature impact stress. Even after the supply of the driving current to the LD module 22 is stopped, the rate of decrease in the temperature of the LD module 22 is lowered by the thermal capacity of the cooling plate 27, and thus it is unlikely that dew condensation will occur.

The cooling water flowing through the cooling plate 27 absorbs heat generated in the LD chips 23 within the LD modules 22 such that the temperature of the cooling water is gradually increased from the upstream side to the downstream side of the cooling water flow path, and thus in general, the temperature of the LD module 22 which is arranged in a position closest to the upstream side is the lowest, with the result that dew condensation easily occurs on the LD module 22 described above. Hence, as shown in FIG. 8, the temperature detection means 15 is arranged on the surface or in the vicinity of the surface of the package 24 of the LD module 22 (the LD module 22 at the leftmost end in FIG. 8) arranged in the position closest to the upstream side when the cooling water is made to flow along the cooling water flow path 10 of the cooling plate 27. In this way, the temperature detected by the temperature detection means 15 is fed back such that the cooling capacity is controlled, and thus it is possible to prevent dew condensation on the LD module 22 on which dew condensation is most likely to occur.

In FIG. 8, as in FIG. 1, thick solid lines represent the cooling water piping system 5 including the cooling water flow path 10, and arrows shown in the vicinity thereof illustrate directions in which the cooling water flows. Moreover, thick solid white arrows and solid white thick lines schematically represent the laser light 17. However, the laser light 17 which includes not only a laser beam propagating in air but also laser light propagating in an optical fiber is represented by the solid white thick lines. The laser optical system 18 in the laser apparatus 300 of the present embodiment that is shown is assumed to include an optical coupling means such as an optical coupler or a beam combiner and a laser medium such as an optical fiber to which an excitation medium is added when the LD module 22 is an excitation light source.

In FIG. 9, for simplification, an optical system for taking out laser light emitted from the LD chip 23 and laser light emitted from the LD chip 23 to the outside of the LD module and an electrical wiring system for passing the driving current supplied from the laser power supply unit 4 to the LD chips 23 are not illustrated.

Figure 10:
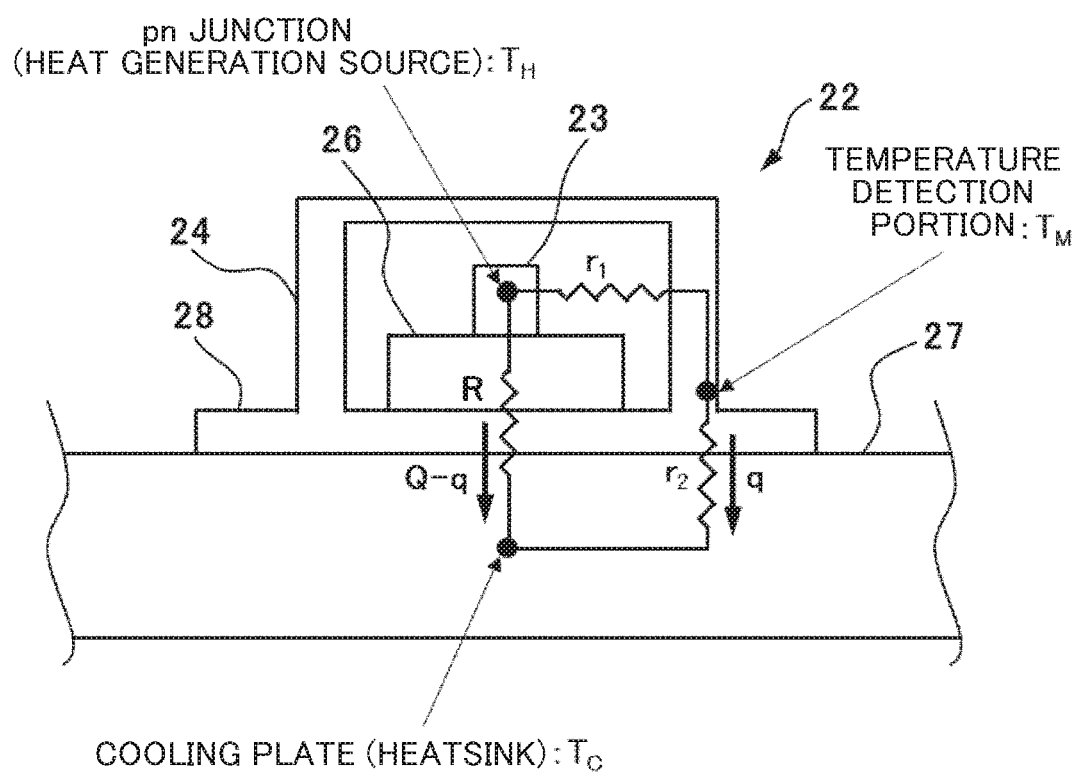
FIG. 10 is a diagram in which a thermal circuit network is added to a schematic cross-sectional view of the LD module.

Here, in order to quantitatively clarify the effects of the present invention, in the present embodiment, how the temperature of the LD chip 23 which affects the acceleration/deceleration of the lifetime consumption of the LD chip 23 is changed by the amount of heat generation in the LD chip 23 and the dew point temperature of the air within the housing 2 is specifically calculated with reference to FIG. 10. FIG. 10 is a diagram in which thermal nodes, thermal resistance between the thermal nodes and the amount of heat that flows through the thermal resistance are added to a schematic cross-sectional view of the LD module. For simplification, only one LD chip 23 is arranged within the package 24.

The thermal node of a heat generation source is a pn junction within the LD chip 23. The thermal node of a heatsink is the cooling plate 27 where the cooling water flow path 10 along which the cooling water flows is provided. A thermal node in the vicinity of the front surface of the side surface of the package 24 is a temperature detection portion whose temperature is detected by the temperature detection means 15. The temperature detection portion is a portion of the package 24 which has the lowest temperature except protrusion portions such as the tab 28. Since heat generated in the pn junction is passed though the package 24 so as to flow into the cooling plate 27, the temperature is considerably increased as the temperature of the LD chip 23 is increased, and as shown in FIG. 10, the temperature of a portion relatively close to the cooling plate 27 is often the lowest. The temperatures of the thermal nodes are individually represented by symbols of $T_H$, $T_C$ and $T_M$, and the thermal resistance from the pn junction to the cooling plate, the thermal resistance from the pn junction to the temperature detection portion and the thermal resistance from the temperature detection portion to the cooling plate are individually represented by symbols of R, $r_1$ and $r_2$. The amount of heat generation in the heat generation source is represented by a symbol of Q, and the amount of heat in the amount of heat generation Q which flows through the thermal resistance other than the thermal resistance of R is represented by a symbol of q. For simplification, it is assumed that thermal resistance except the thermal resistance described above is high, and that thus the amount of heat which flows through the thermal resistance can be ignored.

As a basic relationship, formulas below hold true from a relationship of (temperature difference between thermal nodes=thermal resistance between thermal nodes×amount of heat flowing through thermal resistance), and when the amount of heat generation in the pn junction is changed, the temperature of the pn junction can be calculated from the temperature of the temperature detection portion. When $Q_1$, $T_{H1}$, $T_{M1}$ and $T_{C1}$ are assumed to be known, $Q_2$ and $T_{M2}$ are found, and thus R, $r_1$, $r_2$ and $q_1$ can be calculated. Here, with respect to k, $k=(r_1+r_2)/R=$constant.

$$T_{H1}-T_{C1}=R(Q_1-q_1)=(r_1+r_2)q_1=R(k/(k+1))Q_1 T_{H1}-T_{M1}=r_1 q_1$$

$$T_{M1}-T_{C1}=r_w q_1$$

$$T_{H2}-T_{C2}=R(Q_2-q_2)=(r_1+r_2)q_2=R(k/(k+1))Q_2$$

$$T_{H2}-T_{M2}=r_1 q_2$$

$$T_{M2}-T_{C2}=r_2 q$$

Here, k: $k=(r_1+r_2)/R=$constant $Q_1$: amount of heat generation in pn junction under standard driving conditions $q_1$: amount of heat flowing through thermal resistance ($r_1$, $r_2$) under standard driving conditions $T_{H1}$: temperature of pn junction under standard driving conditions $T_{M1}$: temperature of temperature detection portion under standard driving conditions $T_{C1}$: temperature of cooling plate under standard driving conditions $Q_2$: amount of heat generation in pn junction lower than $Q_1$ $q_2$: amount of heat flowing through thermal resistance ($r_1$, $r_2$) under a condition in which amount of heat generation in pn junction is $Q_2$ $T_{H2}$: temperature of pn junction under a condition in which amount of heat generation in pn junction is $Q_2$ $T_{M2}$: temperature of temperature detection portion under a condition in which amount of heat generation in pn junction is $Q_2$ $T_{C2}$: temperature of cooling plate under a condition is which amount of heat generation in pn junction is $Q_2$ As the amount of heat generation in the pn junction is reduced, the temperature of the temperature detection portion is lowered. When the temperature of the temperature detection portion is lowered down to the switching temperature, the cooling capacity is controlled such as by a method of supplying the cooling water or stopping the supply thereof, and thus the temperature of the temperature detection portion is kept at a temperature substantially equal to the switching temperature. Hence, when temperature of temperature detection portion switching temperature, since the cooling water is continuously supplied, it is considered that the temperature of the cooling plate 27 is hardly changed by the amount of heat generation. Hence, when it is assumed that $T_{C2}=T_{C1}$, the temperature $T_{H2}$ of the pn junction when the amount of heat generation in the pn junction is $Q_2$ can be determined from the formula below which is derived from the formulas described above.

$$T_{HD}=(T_{H1}-T_{C1})Q_2/Q_1+T_{C1}$$

On the other hand, when the temperature of the temperature detection portion is kept at the same temperature as the switching temperature by the control of the cooling capacity, the temperature of the cooling plate 27 is changed by the amount of heat generation but the temperature of the pn junction can be determined by the formula below.

$$T_{H2}=(T_{H1}-T_{M1})Q_2/Q_1+T_{M1}$$

As specific values, when $Q_1=10$ W and $T_{C1}=27°$ C., the temperature of the pn junction is $T_{H1}$=about 65° C., and the temperature detection portion can be set to $T_{M1}$=about 38° C. when the package 24 and the like are appropriately designed.

A description will be given of the following. Under the numerical conditions described above, in three cases, that is, (1) when the LD module 22 is driven under a condition in which an optical output under the standard driving conditions is produced ($Q=Q_1$), when the LD module 22 is driven under a condition in which an optical output is larger than the standard driving conditions ($Q>Q_1$) and (3) when the LD module 22 is driven under a condition in which an optical output is lower than the standard driving conditions ($Q<Q_1$), it is possible to reliably prevent dew condensation on the package 24 and the LDCOS 25, and the lifetime consumption of the LD chip 23 is prevented from being accelerated by an increase in the temperature of the pn junction. The switching temperature is assumed to be switching temperature=(dew point temperature of air within housing 2+1° C.)

(1) In a case where the LD module 22 is driven under the condition in which the optical output under the standard driving conditions is produced ($Q=Q_1$), even when the temperature of the air within the housing 2 is 35° C. and the humidity is 95%, the dew point temperature of the air within the housing 2 is 34.1° C. so as to be lower than the temperature ($T_{M1}$) of the temperature detection portion under the standard driving conditions=38° C. Hence, dew condensation is prevented from occurring on at least the package 24 except the protrusion portions such as the tab 28. The substrate 26 close to the pn junction serving as the heat generation source is further higher in temperature than the temperature detection portion, and thus dew condensation is prevented from occurring on the LDCOS 25 serving as the dew condensation prevention target unit.

Although the switching temperature is 35.1° C., since the temperature ($T_{M1}$) of the temperature detection portion under the standard driving conditions=38° C. is higher than the switching temperature, the supply of the cooling water is prevented from being stopped. Hence, the rate of the lifetime consumption of the LD chip 23 is equal to the rate of the lifetime consumption when the cooling capacity is driven under the standard driving conditions which are standard conditions, and thus the lifetime consumption of the LD chip 23 is prevented from being accelerated as compared with the case of the standard driving conditions.

Hence, in a case where the LD module 22 is driven under the standard driving conditions, when it is assumed that temperature ≤35° C. and humidity ≤95% are the allowable installation environment conditions of the laser apparatus 300, as long as the environment condition is observed, even if the degree of the enclosing of the housing 2 is poor such that air having a high dew point temperature of 34.1° C. infiltrates from the outside, dew condensation is prevented from occurring on the dew condensation prevention target unit, and the laser oscillation can be continued without the cooling capacity being lowered than the standard driving conditions such that the lifetime consumption of the LD chip 23 is prevented from being accelerated.

In a case where the LD module 22 is driven under the condition in which the optical output is larger than the standard driving conditions ($Q>Q_1$), the temperature of the temperature detection portion is even higher than $T_{M1}$=38° C. and thus dew condensation is prevented from occurring on the package 24 and the LDCOS 25. On the other hand, since the optical output is larger than the standard driving conditions, and the temperature of the pn junction is higher than the standard driving conditions, the lifetime consumption of the LD chip 23 is accelerated as compared with the standard driving conditions. However, this not because the lifetime consumption of the LD chip 23 is accelerated due to the dew condensation prevention measures but because optical output larger than the standard optical output (rated optical output) is produced.

(3) In a case where the LD module 22 is driven under the condition in which the optical output is lower than the standard driving conditions ($Q<Q_1$), when the temperature of the pn junction when the amount of heat generation in the pn junction is reduced such that the temperature of the temperature detection portion is lowered down to the switching temperature and the temperature of the temperature detection portion is kept at a temperature substantially equal to the switching temperature by the control of the cooling capacity is calculated by use of the formula described previously, results as shown in FIG. 11 can be obtained.

Figure 11:
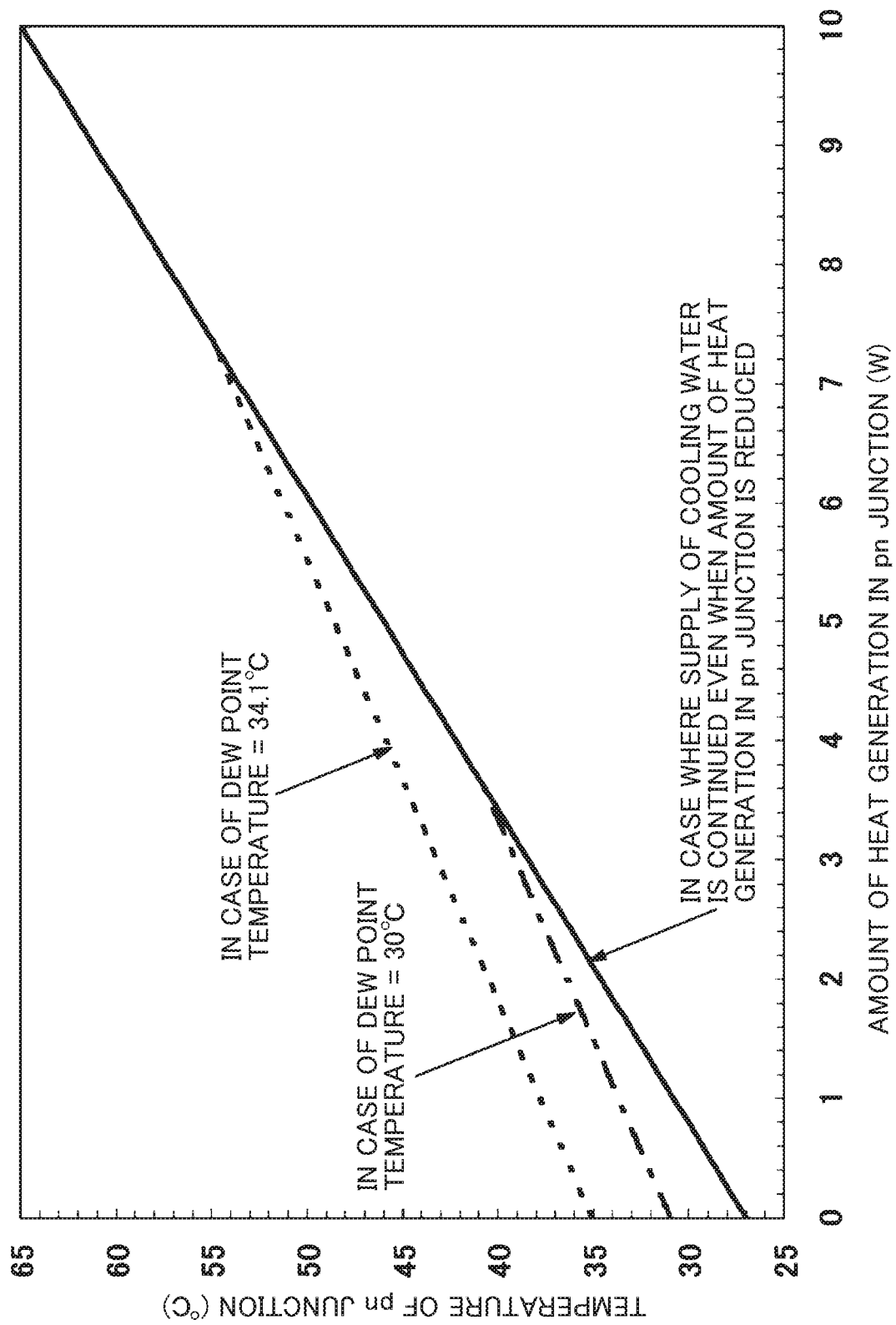
FIG. 11 is a diagram showing the result of calculation of dependence of the temperature of a pn junction on the amount of heat generation in the pn junction in the fourth embodiment of the present invention.

In FIG. 11, a graph indicated by a solid line indicates the dependence of the temperature of the pn junction on the amount of heat generation when the supply of the cooling water is continued even if the amount of heat generation in the pn junction is reduced. A broken line and an alternate long and short dash line indicate the dependence of the temperature of the pn junction on the amount of heat generation when the temperature of the temperature detection means is lowered down to switching temperature=(dew point temperature of air within housing 2+1° C., and thus the supply of the cooling water for preventing dew condensation is stopped. The broken line indicates a case where the dew point temperature of the air within the housing 2 is 34.1° C. The alternate long and short dash line indicates the dependence of the temperature of the pn junction on the amount of heat generation when the dew point temperature of the air within the housing 2 is 30° C. When the temperature of the temperature detection means is lowered down to switching temperature=(dew point temperature of air within housing 2+1° C.), and thus the supply of the cooling water is stopped, since temperature of temperature detection portion (dew point temperature of air within housing 2+1° C.), dew condensation is naturally prevented from occurring on the package 24 and the LDCOS 25.

On the other hand, with respect to the temperature of the pn junction which affects the acceleration/deceleration of lifetime consumption, when the dew point temperature of the air within the housing 2 is 34.1° C., and the amount of heat generation in the pn junction is reduced beyond about 7.4 W, since the temperature of the temperature detection portion is kept at 35.1° C., the cooling water is intermittently supplied. Hence, as compared with the case where the supply of the cooling water is continued, even when the amount of heat generation in the pn junction is reduced, the temperature of the pn junction is not significantly lowered. However, since the reduction of the amount of heat generation means that the driving current is reduced so as to lower the optical output and that as compared with the case where the supply of the cooling water is continued, the temperature of the pn junction is not significantly lowered but the temperature of the pn junction is at least lowered, the lifetime consumption of the LD chip 23 is greatly decelerated as compared with the case where the LD module 22 is driven under the standard driving conditions.

If the dew point temperature of the air within the housing 2 is lowered down to 30° C., the switching temperature is 31° C. Since the cooling water is continuously supplied until the amount of heat generation in the pn junction is reduced to about 3.6 W, in a region which has a small amount of heat generation in the pn junction, as compared with the case where the dew point temperature is 34.1° C., the temperature of the pn junction is further lowered by 4.1° C. Here, 4.1° C. corresponds to a difference in the dew point temperature. Specifically, when the LD module 22 is driven under a condition where the amount of heat generation in the pn junction is small, dew condensation is likewise prevented from occurring on the package 24 and the LDCOS 25, even if the dew point temperature of the air within the housing 2 is as high as 34.1° C. However, as the dew point temperature is lower, the temperature of the pn junction can be kept lower, and thus the lifetime consumption of the LD chip 23 is more greatly decelerated. Hence, although in particular, a dehumidifier is not needed because dew condensation is prevented from occurring on the LD chip 23 and the LDCOS 25 such that the lifetime consumption of the LD chip 23 is not accelerated as compared with the case of standard driving conditions, it is preferable that the dew point temperature of the air within the housing 2 be lower.

In the description of the embodiments discussed above, dew condensation on the dew condensation prevention target unit 13 can be prevented but this means that dew condensation on the other portions is allowed. When the dew point temperature of the air within the housing 2 is high, it is highly likely that in particular, for example, on the inflow side on which the temperature of the cooling water within the cooling water piping system 5 is the lowest, dew condensation will occur. However, the occurrence of dew condensation means that the dew point temperature of the air within the housing 2 is lowered, and as described above, it is preferable that the dew point temperature of the air within the housing 2 be lower. Hence, in order to prevent water droplets generated by dew condensation from being re-evaporated, it is preferable to provide a mechanism for draining the water to the outside of the housing 2.

Figure 12:
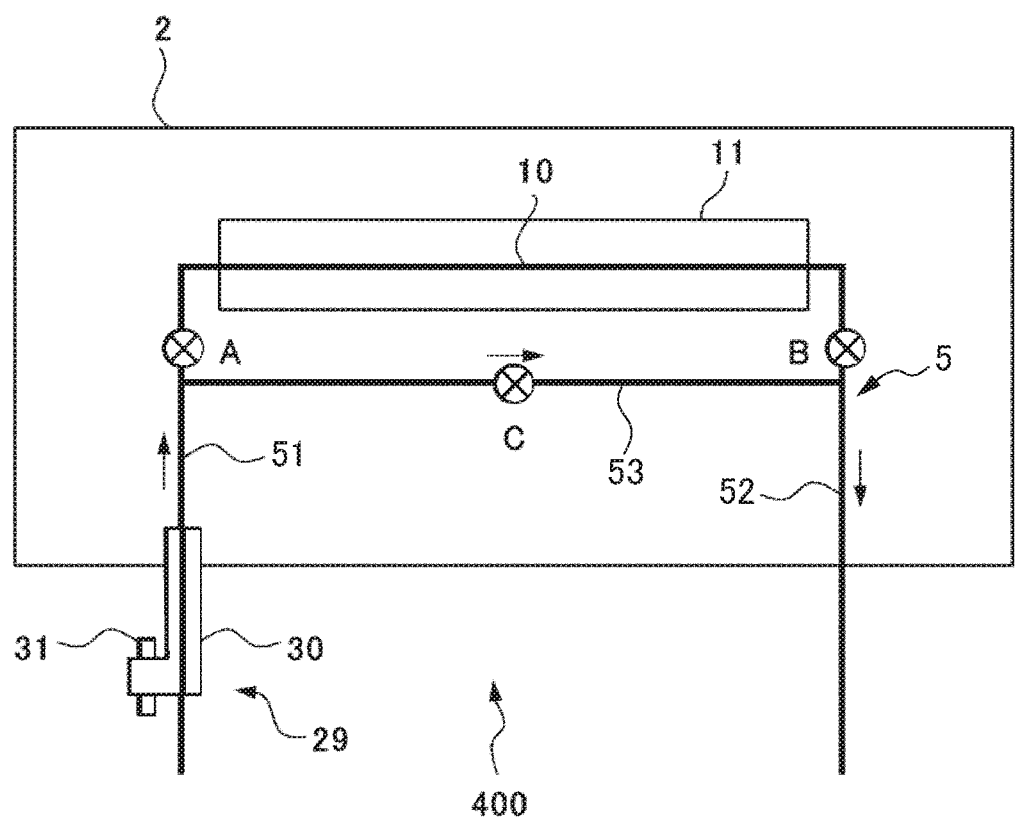
FIG. 12 is a schematic view showing an example of the structure of a drainage mechanism.

As a specific drainage mechanism 29, a structure as shown in FIG. 12 can be considered. In FIG. 12, constituent parts within a laser apparatus 400 which are not related to the drainage mechanism 29 are not shown. The drainage mechanism 29 shown in FIG. 12 includes a capillary member 30 and a heating means such as a heater 31, and is arranged on the piping unit 51 on the inflow side toward the heat receiving/cooling unit 11 in the cooling water piping system 5 so as to straddle the inside and outside of the housing 2. In the drainage mechanism 29, moisture which permeates the capillary member 30 like a fiber bundle is heated and evaporated with the heater 31 or the like in the outside of the housing 2, and thus the capillary member 30 in such a portion is dried, with the result that the water droplets within the housing 2 easily ooze to the outside of the housing 2. However, the drainage mechanism 29 described above is an example, and is not intended to limit the drainage mechanism.

As described above, by providing the drainage mechanism 29 which drains the water generated by dew condensation to the outside of the housing 2 and by enhancing the enclosing of the housing 2, thus the maximum dew point temperature assumed with respect to the air within the housing 2 can also be set lower than the surrounding upper limit dew point temperature which is the upper limit of the dew point temperature of the air around the laser apparatus derived from the allowable installation environment condition of the laser apparatus or the installation condition specification of the laser apparatus.

Figure 13:
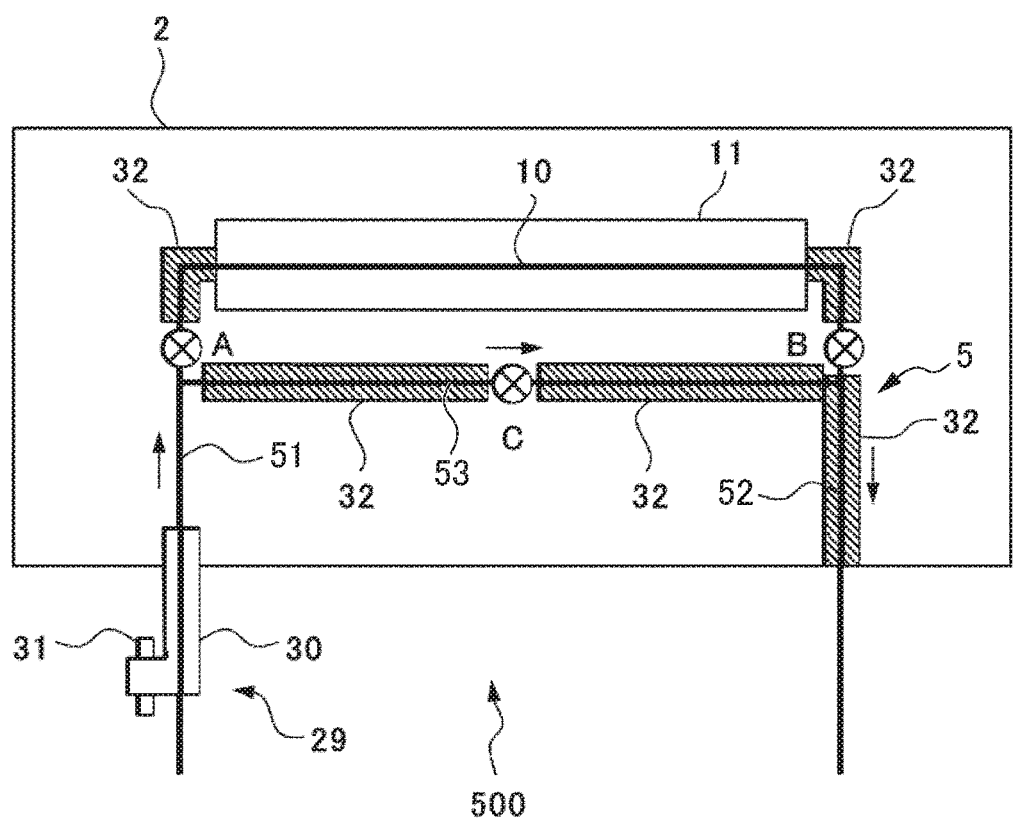
FIG. 13 is a diagram showing an example of the arrangement of a heat insulator.

As in a laser apparatus 500 shown in FIG. 13, a heat insulator 32 for preventing dew condensation may be arranged on the surface of the piping unit 52 on the outflow side on which the cooling water flows out from the heat receiving/cooling unit 11 is the cooling water piping system 5 so that it is not necessary to provide a large number of drainage mechanisms 29 as shown in FIG. 12 and that a place where dew condensation occurs is limited. FIG. 13 shows an example where the heat insulator 32 is provided, in the cooling water piping system 5, on the surface of the piping other than the piping between the connection portion of the piping unit 53 and the arrangement portion of the drainage mechanism 29 in the piping unit 51 on the inflow side.

Furthermore, antirust treatment for reducing corrosion caused by dew condensation may be performed on at least a portion on which dew condensation occurs within the housing 2 or the material of at least the portion on which dew condensation occurs within the housing 2 may be an antirust material. For example, in the example shown in FIG. 13, in order to reduce corrosion caused by dew condensation, antirust treatment such as gold plating can be performed on the surface of the piping unit 51 on the inflow side on which dew condensation occurs in particular or the material of the piping can be an antirust material such as stainless steel. In FIG. 13, constituent parts within the laser apparatus which are not related to the description in this section are not shown.

Fifth Embodiment

Figure 14:
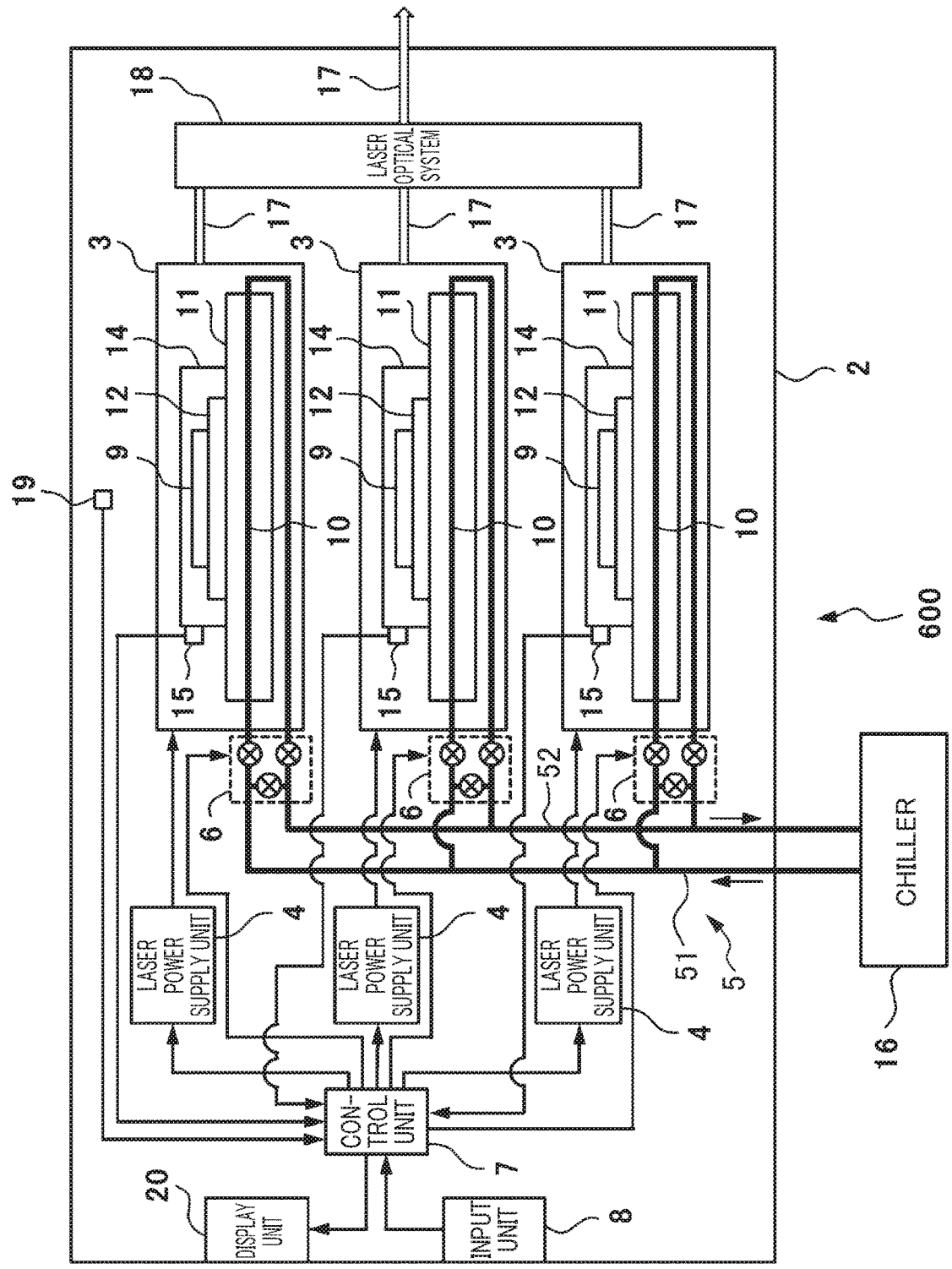
FIG. 14 is a block diagram showing a conceptual configuration of a laser apparatus according to a fifth embodiment of the present invention.

FIG. 14 is a block diagram showing a conceptual configuration of a laser apparatus 600 according to a fifth embodiment of the present invention. The laser apparatus 600 includes: a plurality of heat receiving/cooling units 11 which are thermally connected to a plurality of heat generating units 9; a plurality of cooling capacity control means 6 for independently controlling the cooling capacities which cool the heat receiving/cooling units 11; a plurality of surrounding members 14 which are close to dew condensation prevention target units including the heat generating units 9 and heat generating unit supporting units 12 and which substantially surround the individual dew condensation prevention target units; and a plurality of temperature detection means which detect the temperatures of predetermined portions of the surrounding members 14. A control unit 7 individually controls, according to the results of detection by the individual temperature detection means 15, the cooling capacities for cooling the corresponding heat receiving/cooling units 11 with the corresponding cooling capacity control means 6. Although three laser oscillators 3 are shown in FIG. 14, the number of laser oscillators 3 is not limited to three.

The structure of the present embodiment is provided, and thus for example, as in the present embodiment, the flow rates of the cooling water to a plurality of laser oscillators 3 or, though not illustrated, to the laser oscillators 3 and the laser power supply units 4 are individually controlled, with the result that it is possible to prevent dew condensation on all the dew condensation prevention target units. In the laser apparatus 600 including a plurality of laser oscillators 3, even when only a portion of the laser oscillators 3 is driven, the cooling water is made to flow through only the laser oscillator 3 described above, with the result that it is possible to prevent dew condensation on the dew condensation prevention target units of the other laser oscillators 3 which do not perform oscillation. Even when optical output commands are different for the individual laser oscillators 3, and the amounts of heat generation in the laser oscillators 3 are different, the cooling capacities are individually controlled for each of the laser oscillators 3, and thus it is possible to effectively prevent dew condensation on the laser oscillator 3 having a small amount of heat generation.

In FIG. 14, thick solid lines represent the cooling water piping system 5 including the cooling water flow paths 10, and arrows shown in the vicinity thereof illustrate directions in which the cooling water flows. Moreover, thick solid white arrows and solid white thick lines schematically represent laser light 17, and the laser light 17 emitted from the laser oscillators 3 passed through a laser optical system 18 and is output from the laser apparatus 600.

Sixth Embodiment

Figure 15:
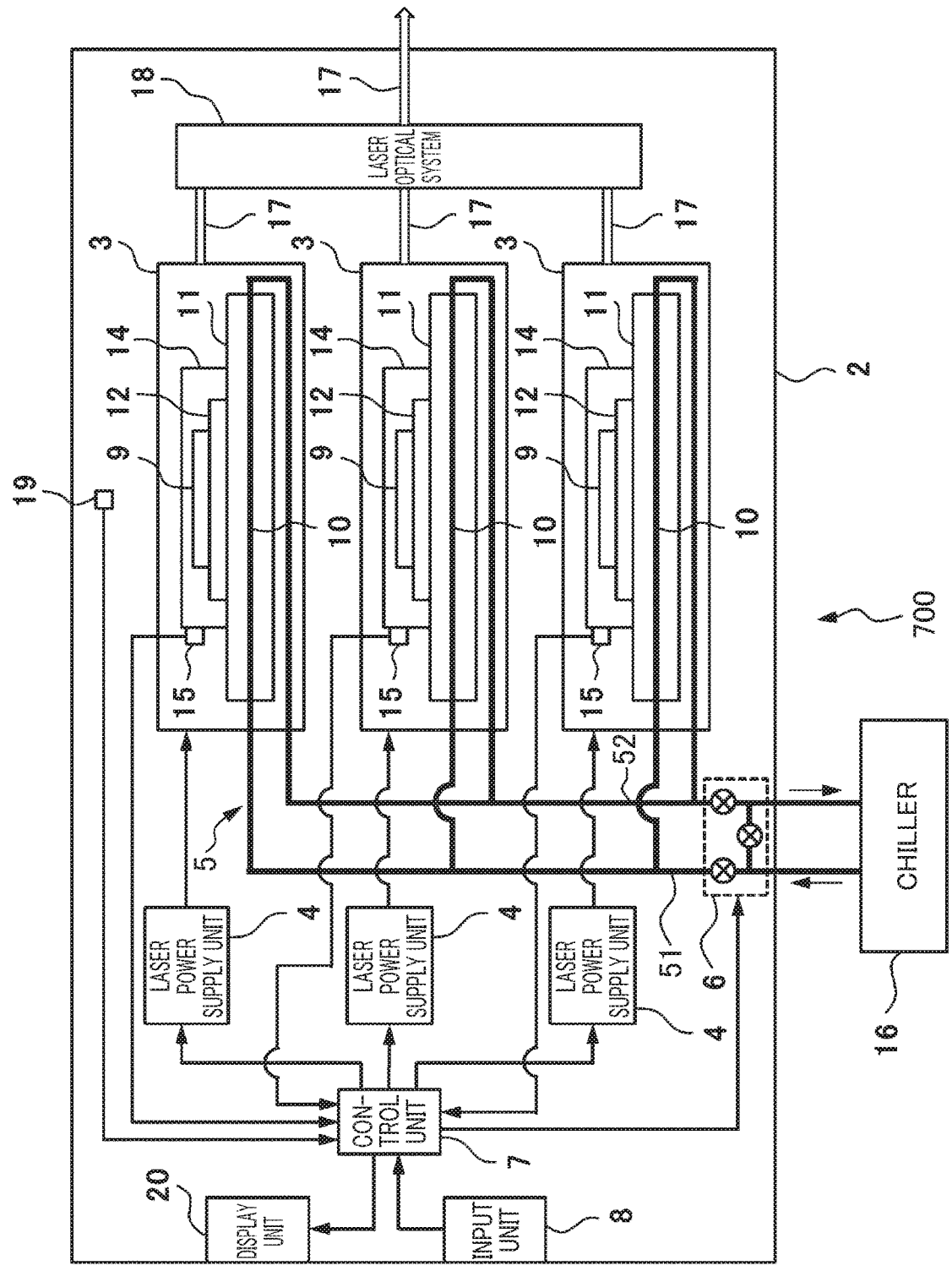
FIG. 15 is a block diagram showing a conceptual configuration of a laser apparatus according to a sixth embodiment of the present invention.

FIG. 15 is a block diagram showing a conceptual configuration of a laser apparatus 700 according to a sixth embodiment of the present invention. The laser apparatus 700 includes a plurality of laser oscillators 3, and further includes: a plurality of heat receiving/cooling units 11 which are thermally connected to a plurality of heat generating units 9 that generate heat for laser oscillation in the individual laser oscillators 3; a cooling capacity control means 6 for collectively controlling the cooling capacities which cool the heat receiving/cooling units 11; a plurality of surrounding members 14 which are close to dew condensation prevention target units including the heat generating units 9 and heat generating unit supporting units 12 and which substantially surround the individual dew condensation prevention target units; and a plurality of temperature detection means which detect the temperatures of predetermined portions of the surrounding members 14. A control unit 7 controls currents supplied from the corresponding laser power supply units 4 to the laser oscillators 3 such that the results of detection by the individual temperature detection means 15 are substantially the same temperatures. Although three laser oscillators 3 are also shown in FIG. 15, the number of laser oscillators 3 is not limited to three.

In the laser apparatus 700 including a plurality of laser oscillators 3, while cooling capacities for cooling the heat receiving/cooling units 11 which are thermally connected to the heat generating units 9 of the laser oscillators 3 are being controlled by a single cooling capacity control means it is possible to prevent dew condensation on all the dew condensation prevention target units including the heat generating units 9 and the heat generating unit supporting units 12.

In FIG. 15, thick solid lines represent the cooling water piping system 5 including the cooling water flow paths 10, and arrows shown in the vicinity thereof illustrate directions in which the cooling water flows. Moreover, thick solid white arrows and solid white thick Lines schematically represent laser light 17, and the laser light 17 emitted from the laser oscillators 3 is passed through a laser optical system 18 and is output from the laser apparatus 700.

As described above, according to the laser apparatuses 1, 100, 200, 300, 400, 500, 600 and 700 of the present invention, it is possible to provide the laser apparatus which can prevent dew condensation on the dew condensation prevention target unit and which has a long lifetime and is reliable, without need for a dehumidification function in particular, hence, without use of a dehumidifier such as a panel cooler whose use is desired to be avoided in terms of cost and size and without the lifetime consumption of the heat generating unit being accelerated by an increase in the temperature of the heat generating unit as compared with the case where the laser apparatus is driven under the standard driving conditions. According to the laser apparatuses 1, 100, 200, 300, 400, 500, 600 and 700 of the present invention, it is possible to solve the problem which cannot be avoided in a conventional laser apparatus using no dehumidifier and in which when the dew point temperature is high, the cooling capacity for preventing dew condensation is inevitably lowered such that the temperature of the heat generating unit such as the laser oscillator is increased and that thus the lifetime consumption of the heat generating unit such as the laser oscillator is accelerated.

EXPLANATION OF REFERENCE NUMERALS

1, 100, 200, 300, 400, 500, 600, 700 laser apparatus
2 housing
3 laser oscillator
4 laser power supply unit
5 cooling water piping system
6 cooling capacity control means
7 control unit
8 input unit
9 heat generating unit
10 cooling water flow path
11 heat receiving/cooling unit
12 heat generating unit supporting unit
13 dew condensation prevention target unit
14 surrounding member
15 temperature detection means
16 chiller
17 laser light
18 laser optical system
19 dew point temperature detection means
20 display unit
21 auxiliary heating means 22 LD module
23 LD, LD chip
24 package (of LD module)
25 LDCOS (LD chip on substrate)
26 substrate (of LD chip)
27 cooling plate
28 tab (of LD module)
29 drainage mechanism
30 capillary member
31 heater
32 heat insulator
A, B, C solenoid valve

What is claimed is:

1. A laser apparatus which comprises:
a housing;
a laser oscillator within the housing, the laser oscillator including,
a laser module including
a laser diode chip, and
a heat receiving/cooling unit that is thermally connected to a dew condensation prevention target unit including at least the laser module and a cooling water flow path for passing cooling water for cooling the dew condensation prevention target unit, and to which a cooling water piping system for passing the cooling water to the cooling water flow path is connected;
a laser power supply unit for supplying a current to the laser oscillator;
a cooling capacity control means for controlling a cooling capacity which cools the heat receiving/cooling unit with the cooling water passing through the cooling water piping system;
a control unit which controls at least the cooling capacity control means and the laser power supply unit;
a surrounding member which is close to the dew condensation prevention target unit so as to surround the dew condensation prevention target unit; and
a temperature detection means which detect a temperature of a predetermined portion of the surrounding member and outputs, as a result of the detection, a surrounding member temperature to the control unit,
the surrounding member is formed so as to reach a surrounding member thermal equilibrium temperature higher than a dew point temperature with respect to air within the housing as a temperature of the laser module is increased, by,
increasing thermal resistance between the surrounding member and the heat receiving/cooling unit, or
blackening an inner wall surface of the surrounding member,
wherein the laser apparatus is driven to emit laser light and to control the cooling capacity for cooling the heat receiving/cooling unit to have a level, and where the laser apparatus or the laser oscillator reaches a thermal equilibrium state in which a temperature of the laser apparatus or the laser oscillator is maintained, and
the control unit compares, while a current output command is being output to the laser power supply unit, the surrounding member temperature detected by the temperature detection means with a switching temperature that is a threshold temperature calculated by the control unit and that is lower than the surrounding member thermal equilibrium temperature, such that,
when the surrounding member temperature is lower than the switching temperature, the control unit controls the cooling capacity control means such that the cooling capacity for cooling the heat receiving/cooling unit is lower than the level, and
when the surrounding member temperature is equal to or higher than the switching temperature, the control unit controls the cooling capacity control means such that the cooling capacity for cooling the heat receiving/cooling unit is equal to or higher than the level.

2. The laser apparatus according to claim 1, further comprising:
a dew point temperature detection means for detecting a dew point temperature of air within the housing,
wherein the dew point temperature of the air within the housing detected by the dew point temperature detection means is a housing interior dew point temperature, and the switching temperature is higher than the housing interior dew point temperature.

3. The laser apparatus according to claim 1, wherein the dew point temperature is a surrounding upper limit dew point temperature which is an upper limit of a dew point temperature of air around the laser apparatus based on an installation environment condition of the laser apparatus or an installation condition specification of the laser apparatus.

4. The laser apparatus according to claim 3, further comprising:
a notification means which visually or auditorily provides, by control of the control unit, a notification that an installation environment of the laser apparatus falls outside a range of the installation condition specification when the dew point temperature of the air within the housing is higher than the surrounding upper limit dew point temperature.

5. The laser apparatus according to claim 1, wherein the predetermined portion where the temperature detection means is installed is a surface of the surrounding member which is in contact with air or a portion in a vicinity of the surface, and whose temperature is lowest except a protrusion portion of the surrounding member or a portion whose temperature is close to the temperature of the portion whose temperature is lowest in a state where the laser apparatus or the laser oscillator reaches the thermal equilibrium state.

6. The laser apparatus according to claim 1, further comprising:
an auxiliary heating means which is thermally connected to the surrounding member,
wherein the control unit controls an amount of heat generation in the auxiliary heating means such that the surrounding member temperature detected by the temperature detection means is higher than the maximum dew point temperature in a state where the laser apparatus or the laser oscillator reaches the thermal equilibrium state.

7. The laser apparatus according to claim 1, wherein the cooling capacity control means includes solenoid valves which open and close a flow path of the cooling water and/or a flow rate adjustment valve which adjusts a flow rate in the flow path of the cooling water, and
the control of the cooling capacity performed by the cooling capacity control means is control of supply and non-supply of the cooling water or the flow rate performed by the solenoid valves or the flow rate adjustment valve.

8. The laser apparatus according to claim 1, further comprising:
a drainage mechanism which drains, to an outside, dew condensation water generated within the housing by making the cooling water flow along the cooling water flow path.

9. The laser apparatus according to claim 8, wherein within the housing, a heat insulator is arranged on a surface of at least one or more portions which are cooled by the cooling water.

10. The laser apparatus according to claim 8, wherein antirust treatment is performed on a portion where dew condensation occurs within the housing so as to reduce corrosion caused by dew condensation or a material of the portion where dew condensation occurs within the housing is an antirust material.

* * * * *